US012560636B2

(12) United States Patent
Noaman et al.

(10) Patent No.: US 12,560,636 B2
(45) Date of Patent: Feb. 24, 2026

(54) CHARACTERIZING RADIO FREQUENCY SOURCES BASED ON DATA FROM A VAPOR CELL SENSOR SYSTEM

(71) Applicant: Quantum Valley Ideas Laboratories, Waterloo (CA)

(72) Inventors: Mohammad Noaman, Waterloo (CA); Kent Arnold Nickerson, Waterloo (CA); Donald Booth, Kitchener (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 19/169,418

(22) Filed: Apr. 3, 2025

(65) Prior Publication Data
US 2025/0314684 A1 Oct. 9, 2025

Related U.S. Application Data

(60) Provisional application No. 63/575,170, filed on Apr. 5, 2024.

(51) Int. Cl.
G01R 29/08 (2006.01)
G01R 33/26 (2006.01)

(52) U.S. Cl.
CPC ..... G01R 29/0885 (2013.01); G01R 29/0892 (2013.01); G01R 33/26 (2013.01)

(58) Field of Classification Search
CPC . G01R 29/0885; G01R 29/0892; G01R 33/26
(Continued)

(56) References Cited

U.S. PATENT DOCUMENTS 9,970,973 B2 5/2018 Anderson et al.
10,509,065 B1 12/2019 Shaffer
(Continued)

FOREIGN PATENT DOCUMENTS

CA 3085935 6/2019
CA 3157522 6/2021
(Continued)

OTHER PUBLICATIONS

Holloway, Christopher L., et al. "Atom-based RF electric field metrology: from self-calibrated measurements to subwavelength and near-field imaging." IEEE Transactions on Electromagnetic Compatibility 59.2 (2017): 717-728. (Year: 2017).*
(Continued)

*Primary Examiner* — Christopher P McAndrew
(74) *Attorney, Agent, or Firm* — Henry Patent Law Firm PLLC

(57) ABSTRACT

In a general aspect, data from a vapor cell sensor system is used to characterize radio frequency sources. In some aspects, a vapor cell sensor system generates output signals by operating one or more vapor cells at an array of locations in a radiating near-field region of an RF field produced by an RF source. Based on the output signals, a signal processing system generates measurement data that represents measured intensities of the RF field in the radiating near-field region. Based on the measurement data, the signal processing system generates a model of the RF field produced by the RF source. The model includes modeled intensities of the RF field in the radiating near-field region and a far-field region of the RF field.

25 Claims, 13 Drawing Sheets

(58) Field of Classification Search

USPC .......................................................... 324/97

See application file for complete search history.

(56) References Cited

U.S. PATENT DOCUMENTS

| | | | |
|---|---|---|---|
| 10,564,201 | B1 | 2/2020 | Shaffer |
| 10,605,840 | B1 | 3/2020 | Amarloo et al. |
| 10,802,066 | B1 | 10/2020 | Keaveney et al. |
| 10,859,981 | B1 | 12/2020 | Ramirez-serrano et al. |
| 11,054,453 | B2 | 7/2021 | Amarloo et al. |
| 11,112,298 | B2 | 9/2021 | Amarloo et al. |
| 11,209,473 | B2 | 12/2021 | Amarloo et al. |
| 11,300,599 | B1 * | 4/2022 | Amarloo ................ G01R 33/26 |
| 11,366,430 | B2 | 6/2022 | Ramirez-serrano et al. |
| 11,681,016 | B1 * | 6/2023 | Bohaichuk .............. G01S 17/88 |
| | | | 342/195 |
| 11,874,311 | B1 | 1/2024 | Dixon et al. |
| 11,885,842 | B1 | 1/2024 | Pandiyan et al. |
| 11,885,904 | B2 | 1/2024 | Bohaichuk et al. |
| 11,899,051 | B1 * | 2/2024 | Pandiyan ........... G01R 33/0052 |
| 2007/0247241 | A1 | 10/2007 | Braun et al. |
| 2016/0363617 | A1 * | 12/2016 | Anderson .......... G01R 29/0885 |
| 2019/0187198 | A1 | 6/2019 | Anderson et al. |
| 2021/0250101 | A1 | 8/2021 | Holloway et al. |
| 2021/0286063 | A1 * | 9/2021 | Amarloo ................ H01Q 17/00 |
| 2022/0196716 | A1 * | 6/2022 | Anderson .......... G01R 29/0892 |
| 2022/0252685 | A1 * | 8/2022 | Popescu ............... G01R 33/243 |
| 2022/0276293 | A1 | 9/2022 | Compton et al. |
| 2022/0326289 | A1 | 10/2022 | Anderson et al. |
| 2023/0152362 | A1 * | 5/2023 | Tilles ................. G01R 29/0885 |
| | | | 324/551 |
| 2023/0296658 | A1 | 9/2023 | Bohaichuk et al. |

FOREIGN PATENT DOCUMENTS

| | | |
|---|---|---|
| CA | 3159327 | 6/2021 |
| CA | 3178752 | 12/2021 |

OTHER PUBLICATIONS

Abbey, et al., "Keyhole coherent diffractive imaging", Nature Physics, Mar. 9, 2008, 6 pages.

Bauschke, et al., "Phase retrieval, error reduction algorithm, and Fienup variants: a view from convex optimization", J. Opt. Soc. Am. A/vol. 19, No. 7/Jul. 2002, 1334-1345, 12 pages.

Bohaichuk, et al., "A Three-Photon Rydberg Atom-Based Radio Frequency Sensing Scheme with Narrow Linewidth", arXiv:2304. 07409 [physics.atom-ph] (2023), 2023, 11 pages.

Bohaichuk, et al., "The Origins of Rydberg Atom Electrometer Transient Response and its Impact on Radio Frequency Pulse Sensing", arXiv:2203.01733, Mar. 3, 2022, 21 pgs.

Chen, et al., "Advances in Phase Retrieval by Transport of Intensity Equation", Proceedings of the 7th International Conference on Photonics, Optics and Laser Technology (Photoptics 2019), pp. 168-173, 2019, 6 pages.

Chen, et al., "Multiple wavelength diffractive imaging", Physical Review A 79, 023809 (2009), Feb. 6, 2009, 4 pages.

Chubar, et al., "Memory and CPU efficient computation of the Fresnel free-space propagator in Fourier optics simulations", Optics Express 28750, vol. 27, No. 20, Sep. 23, 2019, 10 pages.

Dixon, Katelyn, "Rydberg atom-based Electrometry Using a Self-Heterodyne Frequency Comb Readout and Preparation Scheme", Physical Review Applied 19, 034078 (2023)., 2023, 8 Pages.

Eisebitt, et al., "Lensless imaging of magnetic nanostructures by X-ray spectro-holography", Nature vol. 432, 885-888, Dec. 16, 2004, 4 pages.

Fan, et al., "Atom based RF electric field sensing", Journal of Physics B: Atomic, Molecular and Optical Physics 48 202001 (2015), Sep. 9, 2015, 17 pgs.

Fienup, Jr. , "Phase retrieval algorithms: a comparison", Applied Optics, vol. 21, 2758-2769, Aug. 1, 1982, 12 pages.

Fienup, Jr. , "Reconstruction of an object from the modulus of its Fourier transform", Optics Letters, vol. 3, No. 1, Jul. 1978, 27-29, 3 pages.

Gerchberg, et al., "A practical algorithm for the determination of the phase from image and diffraction plane pictures", Optik 35, 1972, 6 pages.

Goodman, "Introduction to Fourier Optics", McGraw-Hill Companies, Inc., 1968, 457 pgs.

Kelly, et al., "Numerical calculation of the Fresnel transform", J. Opt. Soc. Am., vol. 31, No. 4, 755-764, 2014, 10 pages.

Noaman, et al., "Rydberg-Atom Sensors in Bichromatic Radio-Frequency Fields", Phys. Rev. Applied 20, 024068., Aug. 28, 2023, 6 pages.

Noaman, et al., "Vapor Cell Characterization and Optimization for Applications in Rydberg Atom-Based Radio Frequency Sensing", Proceedings vol. 12447, Quantum Sensing, Imaging, and Precision Metrology; 124470V (2023), Mar. 8, 2023, 6 pages.

Pham, Minh, "New Algorithms in Computational Microscopy", Ph.D. thesis, UCLA, 2020, 126 pages.

Rensburg, Danielj. , "Limitations of Near-Field Back Projection for Phased Array Tuning Applications", 5 pages.

Rodriguez, et al., "Oversampling smoothness (OSS): an effective algorithm for phase retrieval of noisy diffraction intensities", J Appl Crystallography 46(Pt 2), 312 (2013)., 13 pages.

Schmidt, et al., "Rydberg atom-based radio frequency sensors: amplitude regime sensing", arXiv:2307.00121v1 [physics.atom-ph], retrieved on Jun. 30, 2023, 33 pages.

Schwettmann, et al., "Field-programmable gate array based locking circuit for external cavity diode laser frequency stabilization", Rev.Sci.Instrum. 82, Oct. 7, 2011, 7 pgs.

Sedlacek, et al., "Atom Based Vector Microwave Electrometry Using Rubidium Rydberg Atoms in a Vapor Cell", arXiv:1304. 4299v1 [physics.atom-ph], Apr. 15, 2023, 5 pages.

Sedlacek, et al., "Microwave electrometry with Rydberg atoms in a vapour cell using bright atomic resonances", Nature Physics, vol. 8, 819-824 (2012), Sep. 16, 2012, 6 pgs.

Shaffer, et al., "A read-out enhancement for microwave electric field sensing with Rydberg atoms", Proc. SPIE vol. 10674, Quantum Technologies 2018, 2018, 12 pgs.

Shapira, et al., "Complete Modal Decomposition for Optical Waveguides", Physical Review Letters 94, 143902, Apr. 14, 2005, 4 pages.

Shechtman, et al., "Phase Retrieval with Application to Optical Imaging", arXiv:1402.7350v1, accessed Feb. 28, 2014, 25 pages.

Shechtman, et al., "Sparsity-based super-resolution and phase-retrieval in waveguide arrays", Optics Express 24015, Oct. 1, 2013, 11 pages.

Williams, et al., "Fresnel Coherent Diffractive Imaging", Physical Review Letters 97, 025506, Jul. 14, 2006, 5 pages.

Yoshida, et al., "On the Sample Complexity of Phase-Retrieval Receiver Based on 2-D Arrayed Photodetectors", OFC 2020, 2020, 3 pages.

Holloway, et al., "Atom-based RF Electric Field Metrology: From Self-Calibrated Measurements to Subwavelength and Near-Field Imaging", IEEE Transactions on Electromagnetic Compatibility, vol. 59 No. 2, Apr. 2017, pp. 717-728 (12 pages).

ISA, International Search Report and Written Opinion issued in Application No. PCT/CA2025/050488 on Aug. 5, 2025, 11 pages.

ISA, International Search Report and Written Opinion issued in Application No. PCT/CA2025/050489 on Aug. 5, 2025, 8 pages.

* cited by examiner

CHARACTERIZING RADIO FREQUENCY SOURCES BASED ON DATA FROM A VAPOR CELL SENSOR SYSTEM

CROSS-REFERENCE TO RELATED APPLICATIONS

This application claims priority to U.S. Prov. Pat. App. No. 63/575,170, which was filed on Apr. 5, 2024, and entitled, "Characterizing Antennas Using Vapor Cell Sensors". The disclosure of the priority application is hereby incorporated herein by reference in its entirety.

BACKGROUND

The following description relates to characterizing radio frequency sources based on vapor cell sensor data.

Vapor cells can be manufactured by sealing a vapor within an enclosed volume. The vapor can be used as a medium to interact with electromagnetic radiation received by the vapor cell. Beams of light generated by lasers can be directed through the vapor to probe and measure the response of the vapor to the received electromagnetic radiation. In this way, a vapor cell can be used to determine properties of the received electromagnetic radiation.

DETAILED DESCRIPTION

Figure 1:
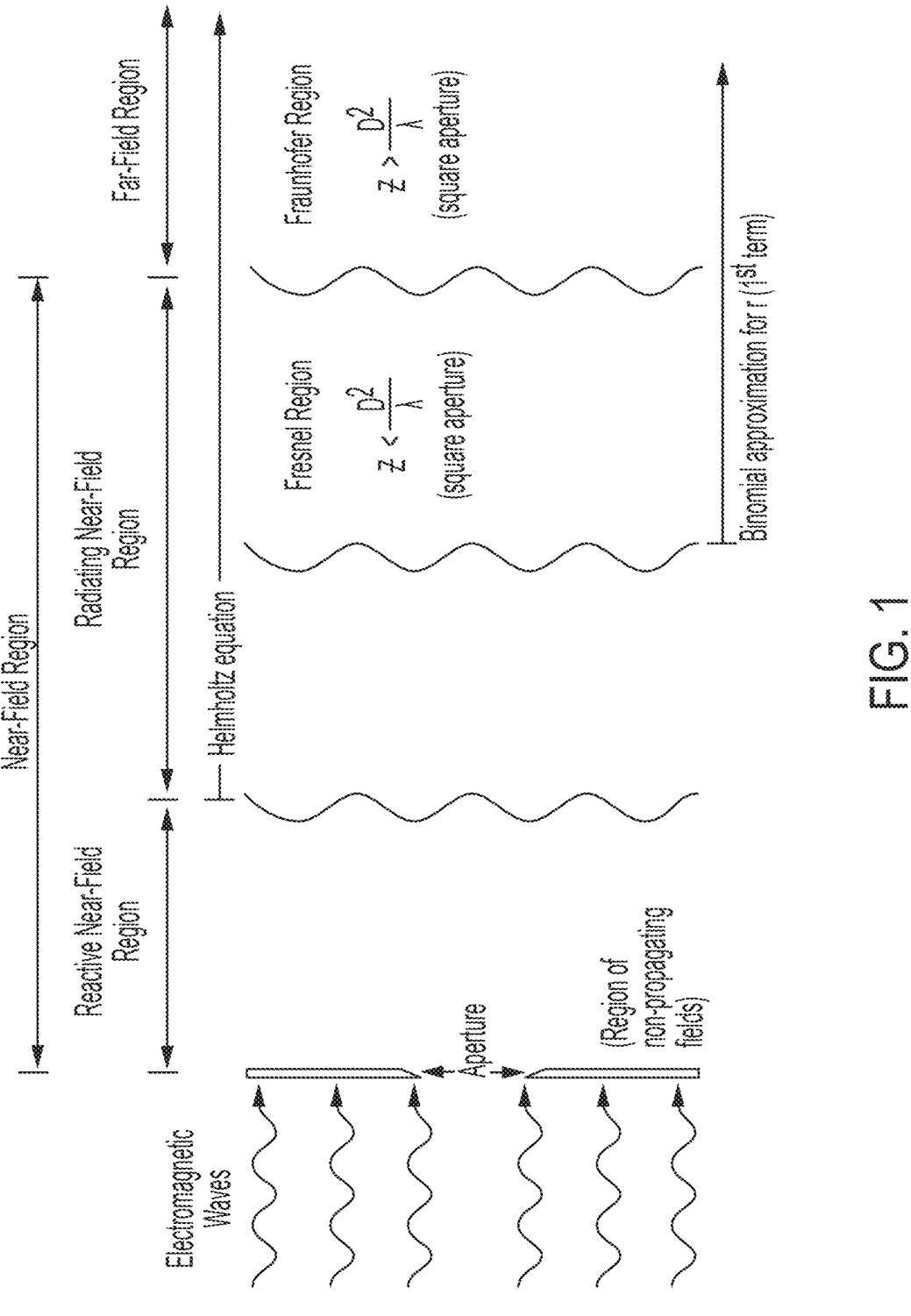
FIG. 1 is a schematic diagram showing examples of different regions for wave propagation that correspond to different assumptions and approximations.

In a general aspect, a vapor cell sensor system is used to characterize a radio frequency (RF) source. In some cases, systems may be configured to make highly accurate measurements of a radio frequency (RF) field emitted by a device, such as an antenna. In certain cases, the measurements may be made close to an aperture of the device, for example, in a radiating near-field region associated with the device (e.g., a Fresnel region). One or more vapor cell sensors may each contain a vapor having Rydberg electronic states, such as a vapor of Rydberg atoms (e.g., Rb, Cs, etc.) or a vapor of Rydberg molecules (e.g., $H_2$, $I_2$, etc.). As such, the vapor cell sensors may be configured as Rydberg vapor-based sensors. By making measurements on two different surfaces separated by more than a wavelength of the RF field, the phase and amplitude the RF field can be determined, for example, using a model that includes a phase-retrieval algorithm (e.g., a Gerchberg-Saxton algorithm). One of the advantages of coupling the phase retrieval technique with Rydberg vapor-based sensors is that the electromagnetic transparency and accuracy of Rydberg vapor-based sensors allows for measurements in the radiating near-field region (e.g., the Fresnel region) that can yield accurate RF field distributions.

Characterizing high frequency devices in the near field region can be very challenging with certain conventional antennas. Conventional antennas can couple to a device so that measurements in the near field are highly inaccurate and therefore not useful. Thus, conventional antennas measure the field distributions in the far-field. The challenge of measuring RF field distributions in the near field threatens the roll-out of 5G-NR in its full form. Devices, like antennas, need to have their radiation patterns characterized because optimization of the gain pattern can increase system range. Moreover, the gain pattern is expected to conform to international and national standards. Furthermore, as the frequencies and effective apertures (or sizes) of the devices increase, it is challenging to do the testing in a standard anechoic chamber with a conventional antenna. For example, the far-field distance for an aperture may be determined by the quantity $D^2/\lambda$, where D is the size (e.g., diameter) of the aperture and $\lambda$ is the wavelength of the RF wave. For a small base station operating at about 28 GHz, the far-field distance can be around 47 m.

In contrast, Rydberg vapor-based sensors are electromagnetically transparent and therefore can be used in the radiating near-field without causing significant interference. The sensors are also self-calibrated and highly accurate (e.g., over 20 times better than conventional technology). Rydberg vapor-based sensors also can sense over a broad spectral range of RF frequencies (e.g., MHz-THz) so that the sensors do not have to be changed in order to make measurements at different frequencies (e.g., like the device harmonics). Moreover, the Rydberg vapor-based sensors can be grouped in arrays for imaging—e.g., for single shot measurements—or by spatially scanning a smaller number of sensors.

To extract the RF field distribution of a device-under-test (DUT), the Rydberg vapor-based sensors can use spatially resolved intensity measurements in two or more measurement domains. For example, the measurement domains may correspond to two different surfaces (e.g., planar surfaces, curved surfaces, etc.) in the radiating near-field region, separated by more than a wavelength of the RF field. The Rydberg vapor-based sensors can also use a phase retrieval algorithm to recover the phase distribution at both surfaces. Once the phase and amplitude are determined on the two measurement domains, then the intensity measurements (e.g., on one of the two measurement domains) can be used to propagate the RF field as an initial condition, using diffraction theory (e.g., the scalar Helmholtz equation) to determine the field distribution throughout space. The phase extraction algorithm may be used because Rydberg vapor-based sensors are square law detectors in steady state. Examples of phase retrieval (or extraction) algorithms include the Gerchberg-Saxton algorithm, the hybrid input-output (HIO) algorithm, the oversampling smoothness (OSS) algorithm, the generalized proximal smoothing (GPS) algorithm, the Fresnel transform algorithm, and so forth. Combinations of algorithms may be possible. In some variations, the phase retrieval algorithm is based on Gerchberg-Saxton methods, which rely on Fourier propagation (e.g., using fast Fourier transforms to propagate the field back and forth between the two measurement planes and applying boundary conditions at each iteration).

In some implementations, a sensing system may include one or more vapor cell sensors that are connected to a laser control and signal processing system. In certain cases, the one or more vapor cell sensors are mounted in an array. The sensing system also includes a signal processing system, which may acquire an analog signal via the principles of Rydberg vapor-based RF electric field sensing. The RF field may have a frequency in, for example, the range of 1 MHz-300 GHz. The analog signal is digitized and stored in a digital format. In certain cases, the baseband signal is directly read into a digital signal processing system, such as one that includes a field programmable gate array (FPGA). The digitized signal can be processed in a number of ways digitally to extract the intensity or power at the one or more vapor cell sensor. Moreover, the digital signal processing system may include dedicated processors like FPGAs or graphics processing units (GPUs), which can run fast Fourier transforms in a massively parallel fashion. Other types of signal processing can be implemented on the same signal processing system, such as time-dependent signal processing (e.g., with matched filters, response templates, frequency comb spectroscopy, etc.). Examples of time-dependent signal processing are described in U.S. Pat. No. 11,885,904 entitled "Sensing Pulses of Radio Frequency Fields" and U.S. Pat. No. 11,874,311 entitled "Detecting Radio Frequency Electromagnetic Radiation Using Vapor Cell Sensors and Comb Spectra". These types of signal processing can be conducted simultaneously with the power measurements required for extracting the RF field distribution. Moreover, the RF detection frequency can be tuned to detect different RF frequencies.

The characterization of high frequency devices, particularly in mm-wave spectrum, can be very challenging with conventional methods that utilize conventional antennas. Rydberg vapor-based sensors offer notable advantages to the problem of testing and measuring high frequency devices. There are challenges at the extremes of size (e.g., small and large) as well at high power that can be mitigated by Rydberg vapor-based sensors. These sensors can be more accurate and electromagnetically transparent as well as serve as an electromagnetic field probe that is conductor free. As antennas become more complicated and integrated, over-the-air (OTA) testing will be used to test entire systems.

Some conventional approaches to antenna radiation pattern measurement usually rely on a field probe that is a conducting antenna, with both the probe and antenna-undertest (AUT) surrounded by a large anechoic chamber. Such chambers are typically large, sealed metallic boxes that are coated internally with foam that absorbs all radiation. Metal cables must be run to and from the AUT and probe to make even the most basic measurements. Moreover, the cables are highly lossy, particularly at high frequencies, and their connections can change the measurements. The antennas used to test the AUT are often scanned using precision robotics. For electrically small antennas—e.g., those whose dimensions are small relative to their operating wavelength—the presence of excess metal structures compounds the difficult challenge of ensuring adequate absorption of their radiation at all but the desired directions. A portable, dielectric, primary standard—such as that based on a Rydberg vapor-based sensor, which is also capable of imaging electromagnetic fields—can outperform the conventional methods as well as allow new primary standard measurements outside the laboratory, unlocking a host of so-far difficult or impossible measurements and calibrations.

Instead of scanning a metal probe, Rydberg vapor-based cells and arrays can be used to take images of the spatial distribution of an RF electromagnetic field emitted by a device-under-test (DUT) with metrological significance in the near-field region. Imaging with Rydberg vapor-based cells (e.g., Rydberg atom-based electrometers) can be quicker, easier, self-calibrated, less intrusive in the electromagnetic environment, and provide naturally broader bandwidth than conventional antennas.

FIG. 1 presents a schematic diagram showing examples of different regions for RF wave propagation that correspond to different assumptions and approximations. Near an aperture (e.g., an RF source), such as in a reactive near-field region, a calculation based on Maxwell's equations may be necessary because there can be both propagating and non-propagating electromagnetic fields that are relevant. For example, if the aperture is metal, plasmons in the aperture can be excited and act as sources. In the reactive near-field region, the electric and magnetic fields are not necessarily orthogonal with a simple relationship between the two. However, in a source-free region (e.g., downstream of the reactive near-field region), and after the reactive near-field components have sufficiently decayed, the Helmholtz equation can be used—e.g., see Eq. (1) below—along with its integral solution, e.g., see Eq. (2) below. The source-free region includes regions such as the radiating near-field region and the far-field region. The former region includes a Fresnel region, and the latter region includes a Fraunhofer region. Fresnel and Fraunhofer regions can arise from a binomial expansion of the radial vector that connects points in the source to the image plane. The Fraunhofer region, in particular, can arise by neglecting the quadratic phase term in the first order binomial expansion, e.g., see Eq. (3) below. The Fresnel approximation includes the quadratic term. In FIG. 1, $D^2$ is the area of a hypothetical square aperture.

Since Rydberg vapor-based sensors operated in the steady state are square law detectors, one way to measure the radiation distribution from a DUT is to use phase retrieval methods. For phase retrieval, one or two spatially separated arrays (e.g., imaging vapor cell sensors), can be placed at two different surfaces along an emission direction in the field of a DUT to determine the amplitude and phase of the electromagnetic field emitted by the DUT. If a full array is not implemented, a vapor cell sensor or array of such sensors can be scanned across the two surfaces. Intensity images at the two surfaces can be used to extract the phase at each of the measurement planes using computational phase retrieval methods. A single array or single vapor cell sensor can be used if the DUT can be translated to different positions. In some variations, phase retrieval methods that use a single intensity measurement may not be appropriate because the assumptions required for the phase and amplitude at the DUT may be too restrictive. Once the phase and amplitude are known along a surface, the emitted electromagnetic field can be determined anywhere, enabling the recovery of the field distribution anywhere. Phase retrieval methods can be more stable than holographic methods and can be conducive for imaging applications where square law detectors are implemented. Phase retrieval methods extract relative phase across a wavefront, which can be sufficient to characterize the electromagnetic field emitted by a DUT.

In some implementations, a system for sensing an RF field distribution of an RF emitting device (e.g., an antenna) includes a laser control box, a signal processing system, a vapor cell mount, a user interface and one or more vapor cell sensors. In some variations, the one or more vapor cell sensors may define an array. In some cases (e.g., if the array is sparse or only a single vapor cell sensor is part of the system), the system may include an actuator system to position the DUT relative to the sparse array or single vapor cell sensor. The actuator system can move the sensor(s) or the DUT or both. The signal processing system can use FPGAs or GPUs, especially for implementing the phase recovery algorithms based on fast Fourier transforms. Other types of signal processing may be used in addition to phase recovery processing, such as the processing of time-dependent signals. The measurements can take place in a laboratory environment, in the field, or in an anechoic chamber.

In some implementations, the system may be configured to use vapor cell sensors (and arrays therefrom) that are positioned in a radiating near-field region (e.g., a Fresnel region) to determine the RF fields emitted from a DUT. Moreover, in certain cases, the Rydberg vapor-based RF sensors may operate in the steady-state, and as such, operate as square law detectors. In these cases, the system (or signal processing system thereof) may use a phase retrieval algorithm—e.g., like the Gerchberg-Saxton or hybrid input output (HIO) algorithm—to determine the phase and amplitude on a surface so that the RF field can be determined anywhere.

Figure 2A:
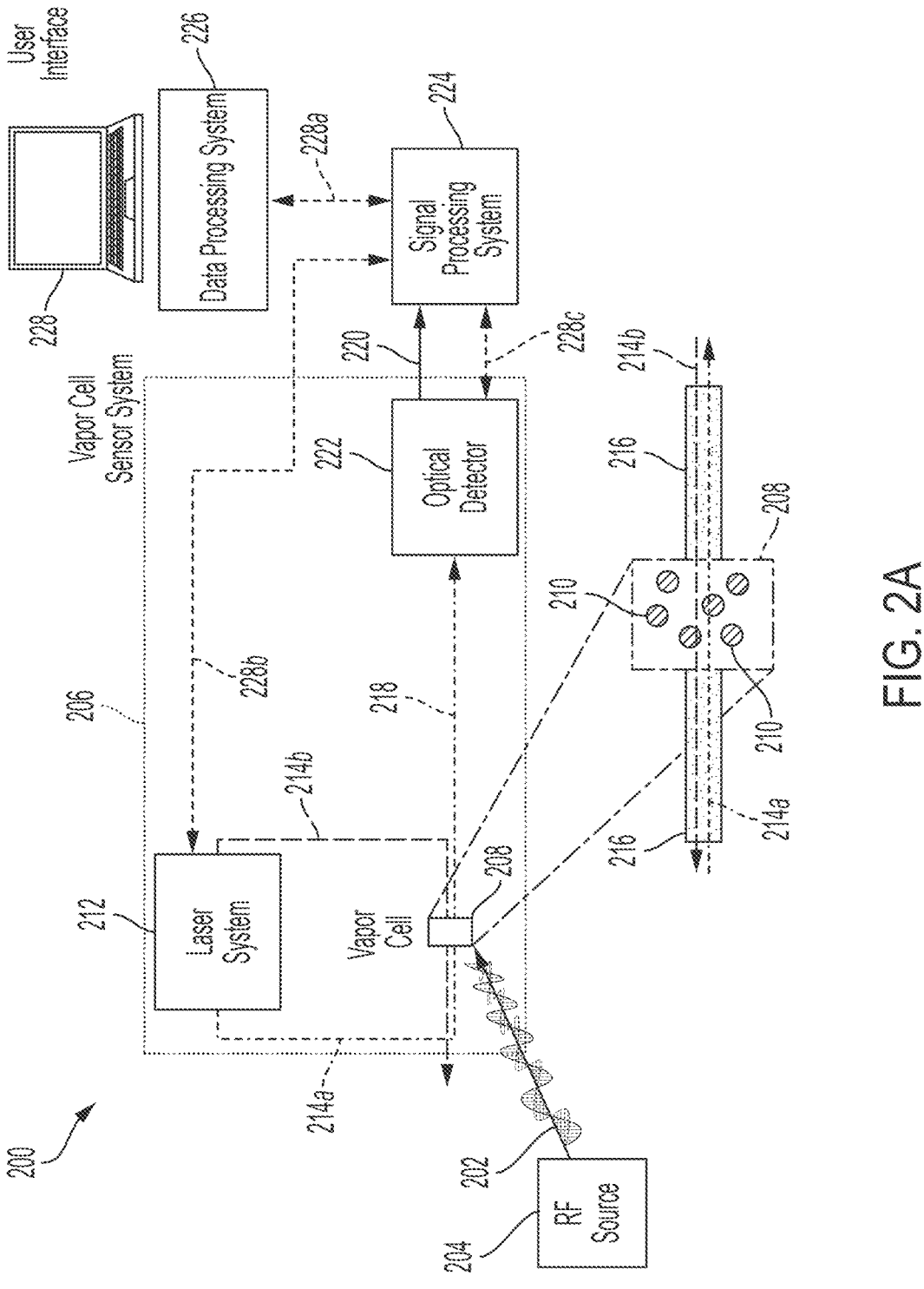
FIG. 2A is a schematic diagram of an example system for sensing an RF field produced by an RF source.

Now referring to FIG. 2A, a schematic diagram is presented of an example system 200 for sensing an RF field 202 produced by an RF source 204. The RF source 204 may be, for example, an antenna-under test (AUT), a device-under-test (DUT), or some other type of RF emitting device. The example system 200 includes a vapor cell sensor system 206. The vapor cell sensor system 206 includes a vapor cell 208 that is configured to contain a vapor 210 having Rydberg electronic states. The vapor 210 may, for example, include one or both of a vapor of Rydberg atoms (e.g., Rb, Cs, etc.) and a vapor of Ryberg molecules (e.g., $H_2$, $I_2$, etc.). In this configuration, the one or more vapor cells 208 may correspond to respective Rydberg vapor-based sensors. Examples of vapor cells configured for Rydberg vapor-based sensing are described in U.S. Pat. No. 10,859,981 entitled "Vapor Cells Having One or More Optical Windows Bonded to a Dielectric Body", U.S. Pat. No. 11,112,298 entitled "Vapor Cells for Imaging of Electromagnetic Fields", U.S. Pat. No. 10,605,840 entitled "Vapor Cells Having Reduced Scattering Cross-Sections and Their Methods of Manufacture", and U.S. Pat. No. 11,054,453 entitled "Photonic-Crystal Vapor Cells for Imaging of Electromagnetic Fields".

Figure 2B:
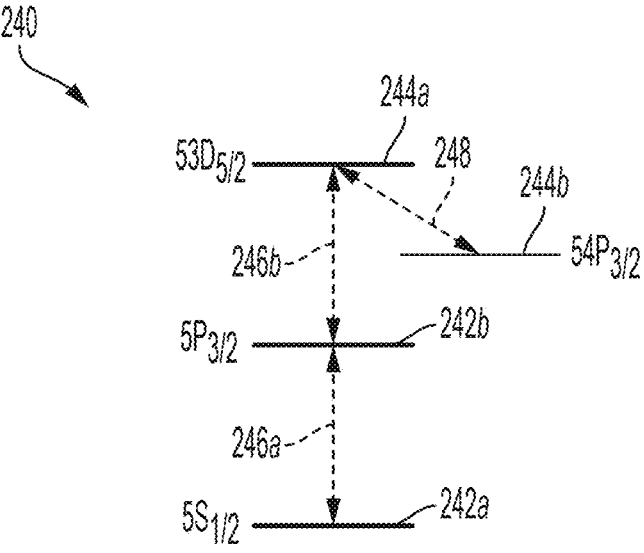
FIG. 2B is a schematic diagram of an example set of electronic states for a vapor of Rb atoms.

In some implementations, the vapor 210 includes a plurality of electronic states that define a ladder of electronic states. For example, FIG. 2B presents a schematic diagram of an example set of electronic states 240 for a vapor of Rb atoms. The example set of electronic states 240 includes first and second electronic states 242a, 242b and first and second Rydberg electronic states 244a, 244b. These states are labeled in FIG. 2B using spectroscopic notation—i.e., $5S_{1/2}$, $5P_{3/2}$, $53D_{3/2}$, and $54P_{3/2}$, respectively—that is applicable to Rb atoms. The first electronic state 242a, the second electronic state 242b, and the first Rydberg electronic state 244a are progressively higher in energy and define a ladder of electronic states. Moreover, the second Rydberg electronic state 244b is lower in energy than the first Rydberg electronic state 244a. However, in some implementations, the second Rydberg electronic state 244b may be higher in energy than the first Rydberg electronic state 244a.

The example set of electronic states 240 defines optical and RF transitions of the vapor of Rb atoms. For example, the energy gap between the first and second electronic states 242a, 242b define a first optical transition 246a. Similarly, the energy gap between the second electronic state 242b and the first Rydberg electronic state 244a defines a second optical transition 246b. The first and second optical transitions 246a, 246b may interact with (e.g., absorb) optical signals, such as laser signals from a laser system. In some variations, the first and second optical transitions 246a, 246b correspond to probe and coupling optical transitions that can interact with, respectively, probe and coupling laser signals. As another example, the energy gap between the first and second Rydberg electronic states 244a, 244b may define an RF transition 248 that interacts with (e.g., absorbs) an RF field, such as one associated with an RF electromagnetic wave. The RF transition 248, when interacting with the RF field, may alter an absorption capability of one or both of the first and second optical transitions 246a, 246b. Thus, the RF transition 248 may provide a mechanism to alter a transmission of a laser signal. For example, the vapor of Rb atoms may receive probe and coupling laser signals that interact with, respectively, the first and second optical transitions 246a, 246b of the vapor. In response to receiving the RF field, which interacts with the RF transition 248 of the vapor, the vapor of Rb atoms may alter a transmission of the probe laser signal through the vapor.

Figure 2C:
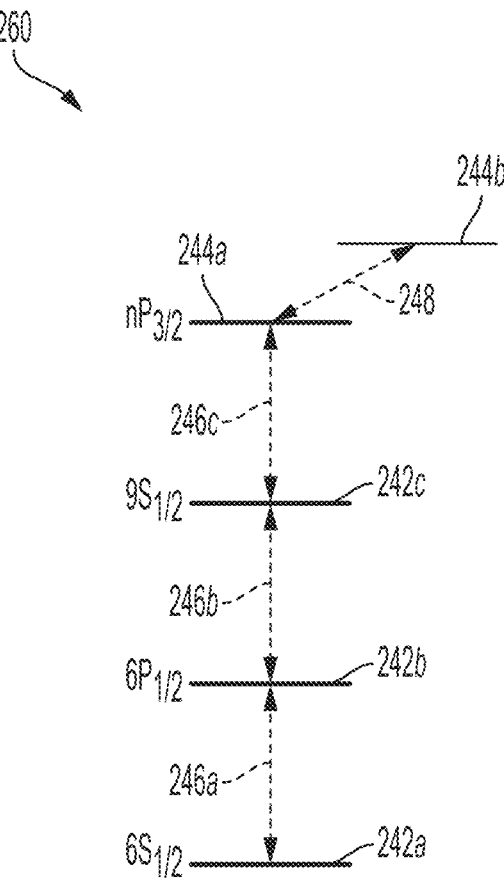
FIG. 2C is a schematic diagram of an example set of electronic states for a vapor of Cs atoms.

In FIG. 2B, the example set of electronic states 240 is depicted as having four electronic states, with two being Rydberg electronic states. However, other numbers and combinations of electronic states and Rydberg electronic states are possible. For example, FIG. 2C presents a schematic diagram of an example set of electronic states 260 for a vapor of Cs atoms. The example set of electronic states 260 includes a third electronic state 242c such that the first electronic state 242a, the second electronic state 242b, the third electronic state 242c, and the first Rydberg electronic state 244a are progressively higher in energy (e.g., define a ladder of electronic states). The energy gap between the second and third electronic states 242b, 242c defines a third optical transition 246c that is configured to interact with (e.g., absorb) optical signals, such as laser signals from a laser system. In FIG. 2C, the second Rydberg electronic state 244b is higher in energy than the first Rydberg electronic state 244a. However, in some implementations, the second Rydberg electronic state 244b may be lower in energy than the first Rydberg electronic state 244a. In some variations, the first optical transition 246a in FIG. 2E corresponds to a probe optical transition that can interact with a probe laser signal. Moreover, the second and third optical transitions 246b, 246c in FIG. 2C correspond to, respectively, first and second coupling optical transitions that can interact with first and second coupling laser signals.

Now referring back to FIG. 2A, the vapor cell sensor system 206 is configured to operate one or more instances of the vapor cell 208 at an array of locations in a radiating near-field region of the RF field 202. In some implementations, such as shown in FIG. 2A, the vapor cell sensor system 206 includes a single vapor cell 208 that is configured to be positioned at the array of locations. Such positioning may occur by moving the single vapor cell 208 and the RF source 204 relative to each other. For example, the single vapor cell 208 may be coupled to an actuator system that moves the single vapor cell 208 to each location in the array of locations. In this example, the array of locations is stationary while the single vapor cell 208 moves. As another example, the RF source 204 may be coupled to an actuator system that moves the RF source 204 such that the single vapor cell 208 occupies each location in the array of locations at a different time (e.g., see the vapor cell 500 described in relation to FIG. 5). In this latter example, the array of locations moves while the single vapor cell 208 is stationary. Such positioning may also occur by configuring a size of the single vapor cell 208 to include at least a portion of the array of locations. For example, the array of locations may include first and second measurement domains. In these cases, the single vapor cell 208 may be configured with an internal volume that is fully occupied by the vapor 210 and is large enough to contain, at separate times, the first measurement domain and the second measurement domain. In this configuration, the single vapor cell sensor 208 may be able to image a measurement domain in a "single shot". Examples of such imaging are described further in U.S. Pat. No. 10,509,065 entitled "Imaging of Electromagnetic Fields" or U.S. Pat. No. 10,802,066 entitled "Single-Pixel Imaging of Electromagnetic Fields".

In some implementations, the vapor cell sensor system 206 includes multiple vapor cells 208 that are configured to be positioned at the array of locations. The multiple vapor cells 208 need not be identical. For example, the multiple vapor cells 208 may be coupled to an actuator system that moves the multiple vapor cells 208, either individually or as a group, such that each location in the array of locations is occupied by an individual vapor cell 208 at some point in time. As another example, the RF source 204 may be coupled to an actuator system that moves the RF source 204 such that each location in the array of locations is occupied by an individual vapor cell 208 at some point in time. In some implementations, the multiple vapor cells 208 define an array of vapor cells.

In some implementations, the vapor cell sensor system 206 includes a laser system 212 optically coupled to the vapor cell 208, such as through free space or through an optical fiber assembly. The laser system 212 is configured to generate laser signals 214 that are transmitted to the vapor cell 208. For example, the laser system 212 may be configured to generate a probe laser signal 214a and a coupling laser signal 214b that are guided by optical fibers 216 to interact with the vapor 210 of the vapor cell 208. FIG. 2A depicts two laser signals 214 defined by, respectively, probe and coupling laser signals 214a, 214b. However, other numbers of laser signals 214 are possible (e.g., one probe laser signal and two coupling laser signals). FIG. 2A also depicts the two laser signals 214 counter-propagating through the vapor 210 along opposing optical paths. However, other configurations of optical paths are possible (e.g., optical paths with parallel propagation). Examples of configurations of laser signals and their interactions with a Rydberg vapor are described further in U.S. Pat. No. 10,509,065 entitled "Imaging of Electromagnetic Fields". In implementations where multiple vapor cells 208 are present, the laser system 212 may be configured to generate an instance of the laser signals 214 for each vapor cell 208.

The vapor cell 208 is configured to generate an optical signal 218 in response to receiving the laser signals 214. The optical signal 218 may be defined by one or more of the laser signals 214 after interacting with the vapor 210. For example, the optical signal 218 may be defined by the probe laser signal 214a after interacting with the vapor 210 (and while the coupling laser signal 214b also interacts with the vapor 210). Such interaction may alter an optical property of the probe laser signal 214a, such as an intensity, a frequency, a polarization, or a phase of the probe laser signal 214a. Combinations of altered optical properties are possible. The optical signal 218 may represent a response of the vapor 210 to RF field 202 (e.g., a transient response, a steady-state response, etc.). In many variations, the RF field 202 has a distribution through space that defines an emission pattern of the RF source 204.

In some implementations, the vapor cell sensor system 206 is configured to generate output signals 220 based on operating the vapor cell 208 at the array of locations in the radiating near-field region of the RF field 202. For example, the vapor cell sensor system 206 may include an optical detector 222 that is optically coupled to the vapor cell 208 to receive the optical signal 218, such as through free space or through an optical fiber assembly. The optical detector 222 is configured to generate the output signals 220 in response to receiving the optical signal 218 from the vapor cell 208. The output signals 220 may represent one or more optical properties of the optical signal 218, such as an intensity of the optical signal 218. For example, the optical signal 218 may be based on the probe laser signal 214a after passing through the vapor 210, and the optical detector 222 may include a photodetector that is configured to generate an electrical signal in response to measuring an intensity of the probe laser signal 214a after passing through the vapor 210. The photodetector may generate multiple electrical signals that represent respective intensities of the probe laser signal 214a over time. However, other optical properties of the optical signal 218 are possible, such as a frequency, a polarization, and a phase of the optical signal 218. Combinations of optical properties are also possible.

In some implementations, the optical detector 222 includes one or more optical elements (e.g., lenses, mirrors, polarizers, filters, gratings, beam splitters, etc.) that can be controlled to manipulate the optical signal 218. Such manipulation may allow the optical detector 222 to measure a target optical property of the optical signal 218, such as via a photodetector. In some implementations, the optical detector 222 includes a photodetector configured to measure a target optical property of the optical signal 218, such as an intensity of the optical signal 218 at a specific frequency (or within range of frequencies). In these implementations, the optical detector 222 may include multiple photodetectors, each configured to measure a different target property of the optical signal 218.

The example system 200 includes a signal processing system 224 that is configured to receive the output signals 220 from the vapor cell sensor system 206 (e.g., from the optical detector 222). The signal processing system 224 may include analog electronics, digital electronics, or both, for processing the output signals 220 once received. The signal processing system 224 is also configured to perform operations that include generating, based on the output signals 220, measurement data representing measured intensities of the RF field 202 in the radiating near-field region. The operations also include generating, based on the measurement data, a model of the RF field 202 produced by the RF source 204. The model includes modeled intensities of the RF field 202 in the radiating near-field region and a far-field region of the RF field 202. In some implementations, the optical detector 222 is configured to generate analog signals and the signal processing system 224 is configured to convert the analog signals into digital signals for subsequent processing (e.g., performing the operations of the signal processing system 224). In these implementations, the signal processing system 224 may include circuits for parallel processing of the digital signals (e.g., FPGAs, ASICs, GPUs, etc.).

In some implementations, the example system 200 includes a data processing system 226 in communication with the signal processing system 224 through a communication channel 228a. The communication channel 228a may be defined, for example, by a wired connection (e.g., an Ethernet connection) or a wireless connection (e.g., a Wi-Fi connection). The data processing system 226 is configured to receive the data from the signal processing system 224, such as for display, for storage, for further processing, or some other type of operation. The data processing system 226 may include a computer that serves as a user interface 228 of the example system 200. Examples of the computer include a desktop computer, a workstation, a server, a laptop, a tablet, a mobile device, and so forth. The user interface 228 is configured to allow a user of the example system 200 to view the data from the signal processing system 224. However, other functionality is possible (e.g., displaying information related to the optical detector 222, controlling the optical detector 222, etc.). In some instances, the data processing system 226 is configured to control the signal processing system 224, such as by using the communication channel 228a therebetween to send control signals (e.g., instructions, data, etc.) to the signal processing system 224. However, data processing system 226 may be configured to control other components of the example system 200, such as the laser system 212 and the optical detector 222. In some instances, the signal processing system 224 and the communication channel 228a are part of the data processing system 226.

In some implementations, the vapor cell sensor system 206 includes an actuator system for moving one or both of the vapor cell 208 and the RF source 204 (e.g., an AUT, a DUT, etc.) relative to each other. The actuator system may include, for example, one or more linear actuators, one or more rotary actuators, or some combination thereof. These actuators may be configured to induce movement using mechanical, electrical, pneumatic, or hydraulic components. Other types of components are possible, including combinations of different types of components. The relative movement provided by the actuator system allows the vapor cell 208 to occupy each location in the array of locations at different times. In some variations, the data processing system 226 is in direct communication with the actuator system, thereby allowing data processing system 226 to control a position and a motion of the vapor cell 208 and the RF source 204 relative to each other. In other variations, the signal processing system 224 is in direct communication with the actuator system, and the data processing system 226 indirectly controls the actuator system by sending control signals to the signal processing system 224 over the communication channel 228a. The position of the vapor cell 208 may include its orientation relative to the RF source 204, and multiple actuator systems are possible. For example, the vapor cell sensor system 206 may include two actuator systems, one for the vapor cell 208 and one for the RF source 204. In these cases, the data processing system 226 is configured to control, directly or indirectly, the position and the motion of the vapor cell 208 relative to that of the RF source 204. The example system 200 may therefore be configured to automatically map, in space, a distribution of the RF field 202 from the RF source 204 (e.g., map a 1D distribution, a 2D distribution, a 3D distribution, etc.).

In some implementations, the example system 200 includes a communication channel 228b between the data processing system 226 and the laser system 212. In these implementations, the data processing system 226 may be configured to control the laser system 212, thereby allowing the data processing system 226 to control an optical property of one or more laser signals 214 generated by the laser system 212. Such control may include altering or maintaining the optical property, and examples of the optical property include an intensity, a frequency, a polarization, a phase, and a detuning of the one or more laser signals 214. Combinations of optical properties are possible.

In some implementations, the example system 200 includes a communication channel 228c between the data processing system 226 and the optical detector 222. In these implementations, the data processing system 226 may be further configured to control the optical detector 222, thereby allowing the optical detector 222 to measure one or more target properties of the optical signal 218. Such control may include controlling optical elements of the optical detector 222 to select a target optical property of the optical signal 218. This control may also include controlling one or more photodetectors, each configured to measure a different target optical property.

Figure 2D:
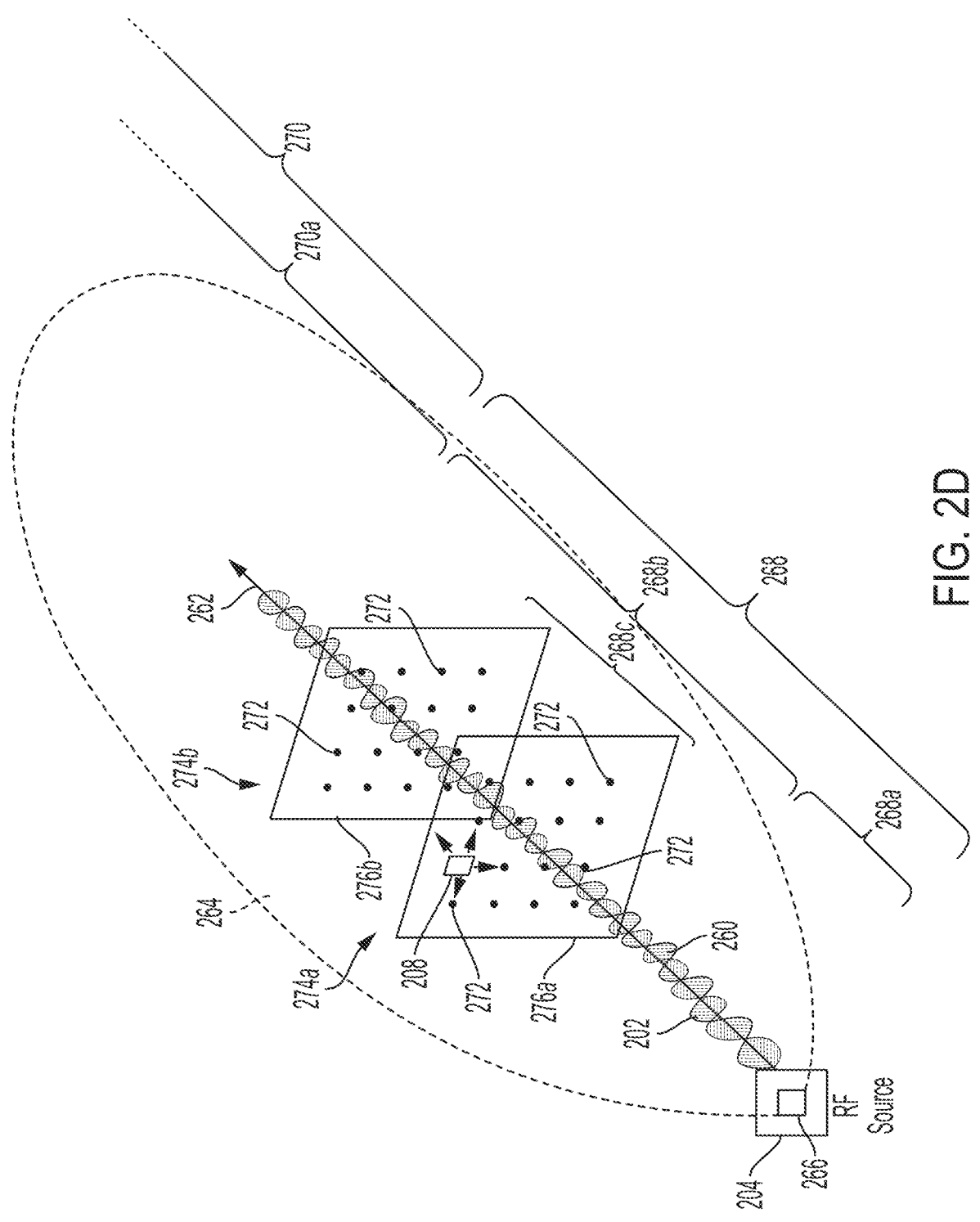
FIG. 2D is a schematic diagram, in perspective view, of an example emission volume through which an RF electromagnetic wave from the RF source of FIG. 2A propagates.

The example system 200 may be used to sense the RF field 202 produced by the RF source 204. Such sensing may include measuring and modeling properties of the RF field 202 in space, such as by determining an intensity and phase distribution of the RF field 202 from the RF source 204. For example, as shown in FIG. 2D, the RF source 204 may be activated to produce an RF electromagnetic wave 260 that propagates along an emission direction 262 from the RF source 204. As such, the RF electromagnetic wave 260 establishes the RF field 202 in an emission volume 264 that extends from an aperture 266 of the RF source 204 along the emission direction 262. The aperture 266 may, in certain cases, correspond to a surface near the RF source 204, perpendicular to the emission direction 262 or thereabouts, through which a majority portion of the RF electromagnetic wave 260 passes.

The emission volume 264 includes various regions that are located relative to the aperture 266. These regions include a near-field region 268 and a far-field region 270 of the RF source 204. The near-field region 268 resides proximate the aperture 266 of the RF source 204 and between the aperture 266 and the far-field region 270. The near-field region 268 also includes a reactive near-field region 268a and a radiating near-field region 268b. The radiating near-field region 268b extends between the reactive near-field region 268a and the far-field region 270. In some instances, the radiating near-field region 268b includes a Fresnel region 268c. In some instances, the far-field region 270 includes a Fraunhofer region 270a. The near-field region 268, the far-field region 270, and their respective interior regions may be analogous to those described in relation to FIG. 1.

During operation, the example system 200 uses the vapor cell 208 to measure an intensity of the RF field 202 in the radiating near-field region 268b. In doing so, the vapor cell

208 measures the intensity of the RF field 202 by receiving the laser signals 214 and generating the optical signal 218 in response. The optical signal 218 is based on a transmission of one of the laser signals 214 through the vapor 210, and the vapor 210 alters this transmission in response to receiving the RF field 202. In many instances, the RF field 202 interacts with an RF transition of the vapor 210, thereby altering a transmission of the probe laser signal 214a through the vapor 210. The optical signal 218 is then received by the optical detector 222, which in turn, generates the output signals 220 of the vapor cell sensor system 206. The output signals 220 may represent one or more optical properties of the optical signal 218, such as an intensity of the optical signal 218. However, other optical properties are possible, such as a frequency, a polarization, and a phase of the optical signal 218. Combinations of optical properties are also possible. In implementations where multiple vapor cells 208 are present, each vapor cell 208 may generate a respective optical signal 218 in response to receiving an instance of the laser signals 214 from the laser system 212.

Also, during operation of the example system 200, the vapor cell sensor system 206 may move the vapor cell 208 and the RF source 204 relative to each other—e.g., via an actuator system—thereby allowing the vapor cell 208 to move to each location in the array of locations 272. The array of locations 272 is positioned in the radiating near-field region 268b of the RF field 202. FIG. 2D illustrates four arrows next to the vapor cell 208 that represent respective examples of movement in the array of locations 272 that are based on a rectilinear coordinate system. However, other directions of movement are possible, including those based on other coordinate systems (e.g., a cylindrical coordinate system, a spherical coordinate system, a curvilinear coordinate system, etc.). The vapor cell 208 measures the property of the RF field 202 at each location in the array 272, such as by stopping at a location during movement. The signal processing system 224 then generates, based on the output signals 220, measurement data that represents the measured properties of the RF field 202 in the radiating near-field region 268b. The signal processing system 224 also generates, based on the measurement data, a model of the RF field 202 produced by the RF source 204. The model may include modeled intensities of the RF field 202 in the radiating near-field region 268b and a far-field region 270 of the RF field 202. In some implementations, the model is a Helmholtz model, such as described below in relation to Eqs. (1)-(3). In some implementations, the model includes modeled intensities of the RF field 202 at a plurality of points that represent an emission pattern of the RF source 204. The emission pattern may occupy part or all of the emission volume that extends from the aperture of the RF source 204.

In some implementations, the array of locations 272 includes first and second measurement domains 274a, 274b in the radiating near-field region 268b. The first and second measurement domains 274a, 274b may, in certain cases, be in a Fresnel region 268c of the radiating near-field region 268b. In these implementations, the measurement data may represent measured intensities of the RF field 202 on or in the first and second measurement domains 274a, 274b. For example, the signal processing system 224 may generate, based on the output signals 220, first and second measurement data when the vapor cell 208 is in, respectively, the first and second measurement domains 274a, 274b. The first measurement data may represent first measured intensities of the RF field 202 on locations 272 of the array in the first measurement domain 274a. Similarly, the second measurement data may represent second measured intensities of the RF field 202 on locations 272 of the array in the second measurement domain 274b. The signal processing system 224 may then generate, based on the first and second measurement data, model data that represents the modeled intensities of the RF field 202 at one or more points in the emission volume 264 of the RF source 204. The one or more points may reside in the radiating near-field region 268b, the far-field region 270, or both.

In some implementations, the first measurement domain 274a corresponds to a first surface 276a, and the second measurement domain 274b corresponds to a second surface 276b. The first and second surfaces 276a, 276b may be planes in the radiating near-field region 268b. For example, as shown in FIG. 2D, the first and second measurement domains 274a, 274b may correspond to first and second planes in the Fresnel region 268c. The first and second planes may be parallel to each other. However, in certain cases, the first and second planes are non-parallel. In these implementations, the first and second surfaces 276a, 276b are separated by a distance greater than or equal to a wavelength of the RF field 202. This distance may allow the signal processing system 224, as part of generating the model, to project the measured intensities onto another surface, such as a third surface in the far-field region 270 (e.g., the Fraunhofer region 270a). Such projection may occur by using an RF diffraction model to generate modeled intensities on the other surface. In such cases, the model may include modeled intensities of the RF field 202 at a plurality of locations on the other surface.

In some implementations, the signal processing system 224 generates modeled phases of the RF field 202 on the first and second surfaces 276a, 276b. For example, the model may include modeled phases of the RF field 202 on the first and second surfaces 276a, 276b. In these cases, generating the model may include using a phase retrieval algorithm to generate the modeled phases based on the measurement data. The signal processing system 224 may thus use the phase retrieval algorithm to generate first modeled phases of the RF field 202 on the first surface 276a based on the first and second measurement data. Similarly, the signal processing system 224 may use the phase retrieval algorithm to generate second modeled phases of the RF field 202 on the second surface 276b based on the first and second measurement data. Examples of phase retrieval algorithm include a Gerchberg-Saxton algorithm, a hybrid input-output (HIO) algorithm, an oversampling smoothness (OSS) algorithm, a generalized proximal smoothing (GPS) algorithm, a Fresnel transform algorithm, and so forth. Combinations of algorithms may be possible.

The signal processing system 224 may utilize the measured intensities and the modeled phases to generate modeled properties of the RF field 202 in the emission volume 264. For example, as part of generating the model, the signal processing system 224 may select boundary data that includes the measured intensities and the modeled phases of the RF field 202 on at least one of the first and second surfaces 276a, 276b. The signal processing system may also use an RF diffraction model to generate the modeled intensities of the RF field 202 in one or both of the radiating near-field region 268b and the far-field region 270 based on the boundary data.

In implementations where multiple vapor cells 208 are present, the vapor cell sensor system 206 may include an actuator system to move the multiple vapor cells 208 individually or in a group. For example, the multiple vapor cells 208 may include a first vapor cell. In these cases, the signals processing system 224 (or data processing system 226) may send instructions to the actuator system to move the first vapor cell to each location in the array of locations 272. In some implementations, the vapor cell sensor system 206 includes a mount that is configured to hold the multiple vapor cells 208 at respective locations of at least a portion of the array of locations 272. For example, the multiple vapor cells 208 may include first and second vapor cells, and the mount may be configured to hold the first and second vapor cells on or in, respectively, the first and second measurement domains 274a, 274b. In these cases, the vapor cell sensor system 206 may include an actuator system that moves the mount, thereby moving the first vapor cell to locations in the array of locations 272 in the first measurement domain 274a while simultaneously moving the second vapor cell to locations in the array of locations 272 in the second measurement domain 274b. This simultaneous motion may allow the vapor cell system 206 make measurements of the RF field 202 simultaneously in the first and second measurement domains 274a, 274b.

One foundational problem in RF test and measurement is that, as applications are pushed to higher RF frequencies, conductive testing is no longer viable. Since the RF spectrum is a commodity, all devices that utilize RF electromagnetic fields are expected to meet standards and therefore require testing. Engineers also need useful tools to develop such devices. At RF frequencies above 20 GHz, particularly those in the so-called 'FR2' bands, engineering and testing can suffer from a lack of accurate and efficient tools to characterize devices.

Test and measurement of RF devices can be done by spatially scanning an antenna (e.g., a receiver) or the DUT. However, this process can be slow, requires high accuracy scanning, and is susceptible to interference. Moreover, the antennas used for testing are limited to accuracies of 4-20% above about 20 GHz, which degrades further as the frequency increases. The RF scanner is usually expensive and creates a more complicated test environment. In many cases, the RF scanner is a large metal robotic arm. The arm is complicated to set up for RF testing, which exacerbates the time required to characterize the RF device. In certain cases, the overall test system may also drift in time. It is generally not possible to use conventional technology to image RF electromagnetic fields in the sense of a camera, such as acquiring an image of the RF electromagnetic field in a single instance. Because the antenna is metallic, the testing happens in the far-field. Otherwise, the scanning antenna would couple to the DUT and perturb the measurements.

Rydberg vapor-sensing technology is well-suited for imaging and array applications for several reasons. The vapor cell sensors can be all-dielectric so they are more electromagnetically transparent than sensors based on antennas. The vapor cell sensors can also be made smaller than the target carrier wavelength and in almost any shape and size. Moreover, the spatial resolution of a vapor cell sensor can be determined by the optical preparation and readout beams rather than the geometry of the sensor. The readout is optical, so the laser signals sent to and from the vapor cell sensor also minimally interfere with the measurements and each other. In addition, the vapor cell sensors are self-calibrated. Antennas are not self-calibrating and can have varying responses, which makes them susceptible to distorting the measured RF image.

Figure 3:
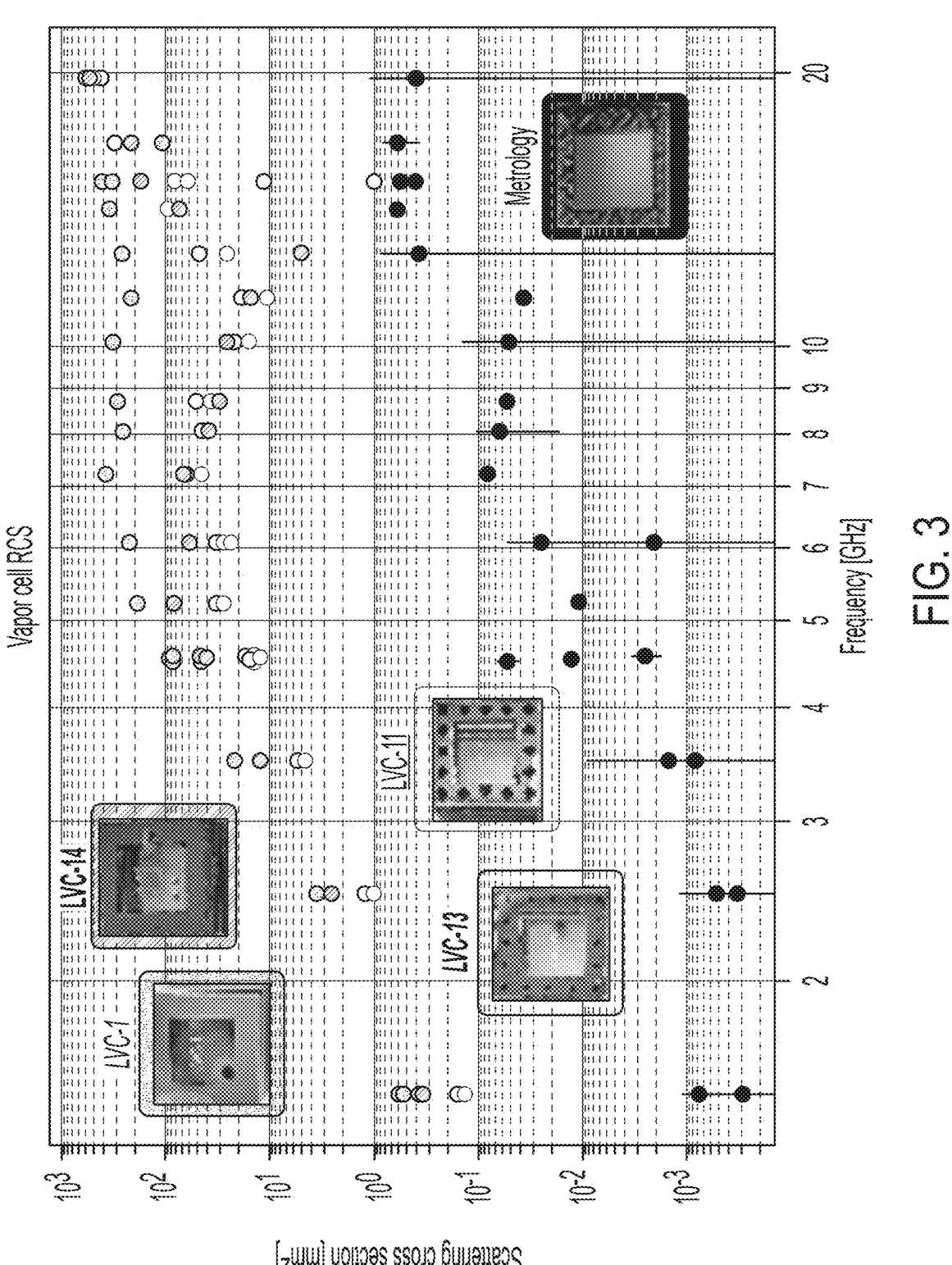
FIG. 3 is a graph showing examples of reduced scattering cross-sections (RSC) for various vapor cell sensors as a function of frequency.

FIG. 3 presents a graph showing examples of reduced scattering cross-sections (RSC) for various vapor cell sensors as a function of frequency. The graph ranges from about 1 GHz to 20 GHz. All the vapor cell sensors except the metrology vapor cell have a volume of about 1 cm³. The structures of the vapor cell sensors are shown as images in FIG. 3 and are coded by grayscale fills. In FIG. 3, the vapor cell sensors corresponding to the labels LVC-13, LVC-11, LVC-1 and LVC-14 are all 1-cm cubic vapor cell sensors. However, the metrology vapor cell is 2.9 mm×3.1 mm×1.5 mm.

Rydberg vapor-based sensors with fully dielectric construction and absolute measurement capability are advantageous for imaging applications and RF sensor arrays. These sensors can be arranged in arrays to take 'snap shots,' much like an optical camera. Moreover, the vapor cell sensors are electromagnetically transparent. However, in certain cases, the Rydberg vapor-based sensors may operate in the steady state and thus function as square law devices. In these cases, they do not directly measure the RF wave. Instead, they measure its absolute squared amplitude, and as such, interference of some kind may be required to measure its phase.

The phase detection of RF fields can be nuanced as different applications may require comparing the phase to a different reference RF field. In these cases, the phase may be a relative quantity. In holography, the reference RF field is generated by a source, such as an RF antenna. For the characterization and propagation of a wavefront, including its direction of propagation, it is the relative phase across the wavefront that is useful for measurement. Shifting the phase by some constant amount for every electromagnetic field point does not affect the measurement. If a signal is encoded in an electromagnetic wave, such as for communications, it is important to measure the phase of the signal relative to an absolute reference (e.g., a timing signal) in order to determine the symbol (e.g., + or −). Phase reconstruction and optical phase detection can be combined or used independently depending on the application. The Rydberg vapor-based sensors (e.g., vapor cell sensor 208 of example system 200 or arrays thereof) may thus be configured to measure the phase and amplitude across a wavefront in order to propagate the wavefront to any position in space. Such projection may be achieved by using a phase retrieval algorithm performed in a radiating near-field region of the RF field.

In some implementations, an RF electromagnetic field can be described by a complex valued field. At each field point, two numbers are specified, typically an amplitude and a phase. If the amplitude and phase of the RF electromagnetic field are known on a surface in a source free region (e.g., a radiating near-field region), the electromagnetic field can then be propagated using Maxwell's equations and, in principle, can be known at any position. If RF sources are nearby, then their characteristics must be known in advance and the problem is more complicated, since there are non-propagating electromagnetic fields around the RF sources. Typically, it is the propagating RF electromagnetic field in free-space that is of interest for over-the-air measurements and for the reception of a communications or radar signal. For applications, the phase and amplitude of the RF electromagnetic field can be measured over a surface. For a source free region, the propagation can be described using the Helmholtz equation for the scalar electromagnetic field amplitude, U. The Helmholtz equation for U is shown by Equation (1) below:

$$\nabla^2 U + k^2 U = 0, \tag{1}$$

and its integral solution is represented by Equation (2), $$U(x, y, z) = \frac{1}{i\lambda} \int \int U(x, y) \frac{e^{ikr}}{r} dX dY \qquad (2)$$

where, $$r = \sqrt{(X - x)^2 + (Y - y)^2}. \qquad (3)$$

Here, z is the propagation distance to the new, measurement plane (or surface); x and y are the transverse coordinates in the measurement plane; X and Y are the transverse coordinates in the initial, source plane; and $\lambda$ is the wavelength. $k=2\pi/\lambda$ is the propagation constant. Eq. (2) indicates that each point in the source plane generates a spherical wave that propagates to the measurement plane. The problem for RF frequencies is somewhat simplified by the practical fact that RF devices have a finite aperture, meaning that they have finite support. In other words, they only have a finite region in either plane where the phase and amplitude are effectively non-zero. This characteristic suggests that an array of sensors can be used to characterize the RF electromagnetic field emitted from an RF device in a single shot or continuous mode, provided the sensors do not significantly perturb the measurement. The criterion for a significant perturbation may, for example, be whether or not the RF electromagnetic field can be propagated accurately, so the interpretation of 'significant' may be specific to the problem being modeled. Rydberg vapor-based cells may be electromagnetically transparent and are capable of self-calibrated (e.g., absolute) measurement, suggesting they can be used for RF field characterization. An angle dependent factor in Eqs. (1)-(2) has been neglected in order to simplify them, which is required for an off-axis propagation.

FIG. 1 shows the different regions where approximations to the Helmholtz equation are valid. In the reactive near-field region, the presence of non-propagating components of the RF electromagnetic field can complicate measurements. In this region, there isn't a simple relationship between the electric and magnetic fields. Maxwell's equations must be solved using the boundary conditions and the RF sources present to determine the electromagnetic fields. Outside the reactive near-field region, in the case where no sources are present (e.g., free-space), the Helmholtz equation is valid. A scalar representation of the electromagnetic field can be used to fully determine the RF electromagnetic field. In the Fresnel zone, a binomial approximation is made to Eq. (3) by assuming $z^2 >> (x-X)^2 + (y-Y)^2$. The Fraunhofer approximation neglects the quadratic phase factor in the source plane, proportional to $X^2 + Y^2$. Making the Fraunhofer approximation reduces the problem to taking a spatial Fourier transform of the source plane, while the Fresnel approximation is carried out by taking the spatial Fourier transform of the source plane weighted by the quadratic phase factor. The importance of the Fresnel and Fraunhofer regions is that the RF electromagnetic field can be efficiently propagated on computers using fast Fourier transforms which are highly efficient. The Fresnel and Fraunhofer approximations allow analytic calculations for many geometries. In contrast, the complexity of Maxwell's equations, and even Eq. (1), make a solution in the reactive near-field region of FIG. 1 computationally expensive.

In summary, if the phase and amplitude of an RF electromagnetic field are measured on a surface (e.g., a plane), then the RF electromagnetic field can be determined virtually everywhere. Most RF electromagnetic fields of interest, and certainly those of interest in RF test and measurement, may be non-zero over a finite region, such as the aperture of a DUT at the source plane. The RF electromagnetic field emitted by the DUT may thus need to be sampled at a rate high enough to characterize the DUT.

In some implementations, the phase retrieval approach is founded on wave propagation, as described by the Helmholtz equation. A qualitative interpretation of the Helmholtz equation can be obtained by understanding the Huygens wave propagation principle. If an RF electromagnetic wave or source has an aperture (e.g., a wave of finite extent and therefore energy), each point over the surface of the wave can be interpreted as a spherical wave source. As the spherical waves propagate, they can interfere with one another to create the wavefront of an advancing wave. As a consequence, each element along the wave may be a complex interferogram that is governed by the Helmholtz equation. Phase retrieval approaches work by taking advantage of this self-referencing of the wave front as it propagates. By computationally propagating the wave back and forth between at least two surfaces (e.g., planes) and imposing measured quantities (e.g., intensities) and boundary conditions (e.g., the aperture) on the solutions, the complex waveform can be determined. In many variations, the two surfaces are located more than a wavelength apart.

The intensity data at the two surfaces may contain the amplitude and phase information of the complex field. The phase and amplitude relationship at different positions along the wavefronts in the two surfaces may also be fixed by the rules for wave propagation. These physical principles can constrain the phase and amplitude enough to determine the complex waveform from the two intensity measurements. Different algorithms for phase retrieval are distinguished by the nature of how the intensities and boundary conditions are imposed. In some variations, the phase retrieval algorithm is a Gerchberg-Saxton (GS) algorithm. In some variations, the phase retrieval algorithm is a hybrid input-output (HIO) algorithm.

In some implementations, the back-and-forth propagation may be accomplished computationally using fast Fourier transforms (FFTs), as the planes are separated by a distance that corresponds to the Fresnel or Fraunhofer approximations. These mathematical routines can be optimized for graphics processing units (GPUs) and FPGAs, so they can be carried out efficiently. Moreover, the sampling rate may be determined by the spatial frequencies of the wavefront. In cases where the target waveforms do not have large spatial frequencies, the sampling criterion is not prohibitive.

Figure 4:
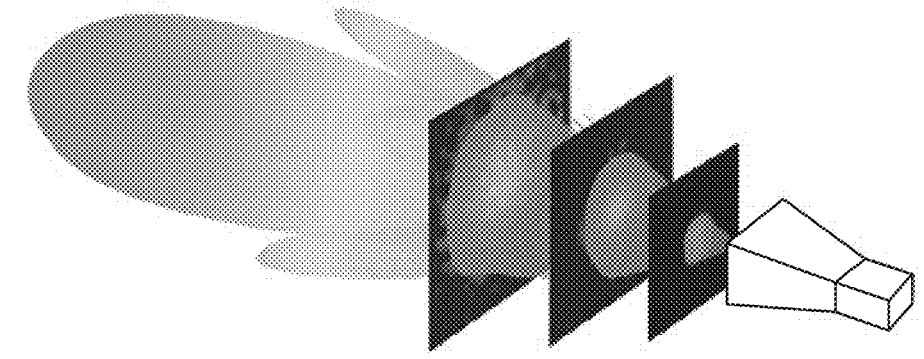
FIG. 4 is a schematic diagram and graph that show an example measurement of an RF electromagnetic field at two planes in the near field.
Figure 4:
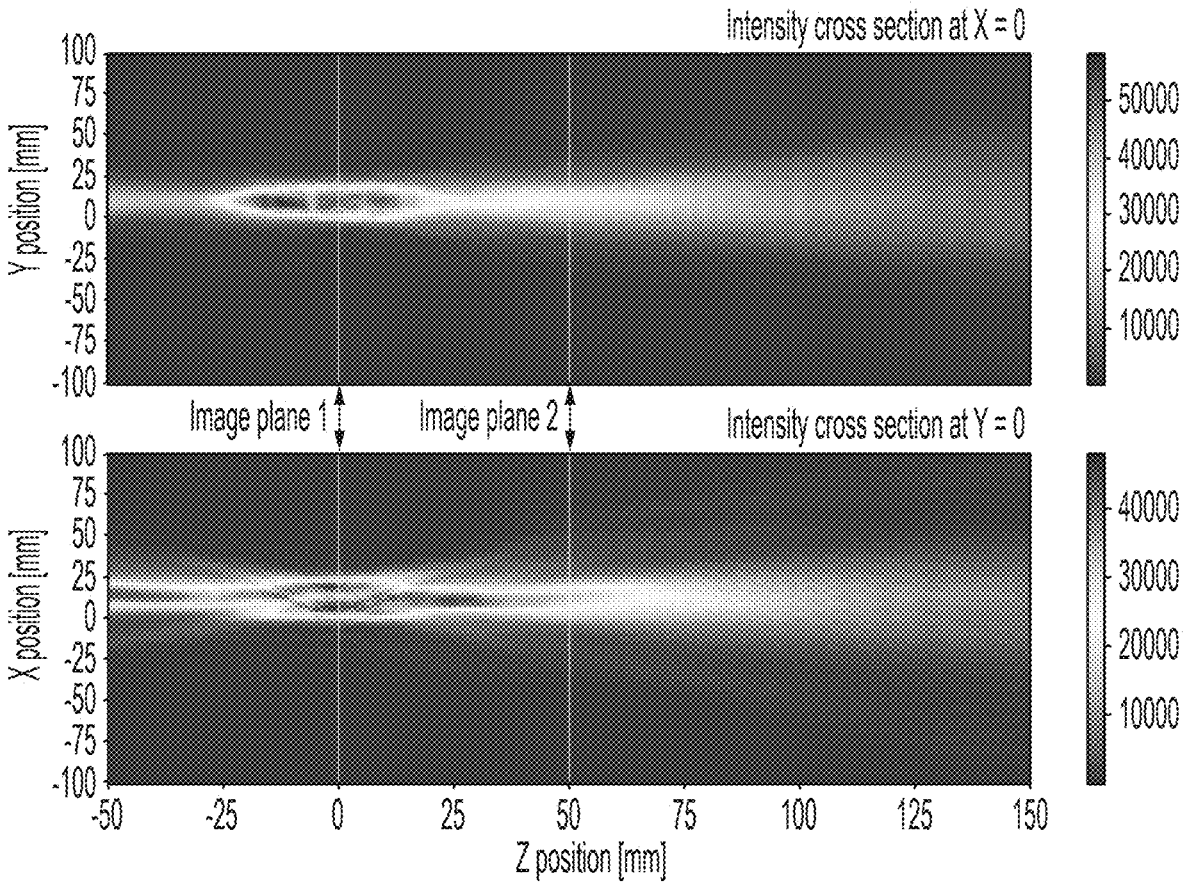

FIG. 4 presents a schematic diagram and graph that show an example measurement of an RF electromagnetic field at two planes in the near field. Intensity measurements are taken at the two planes. These measurements can be used with a phase retrieval algorithm to extract the far-field antenna pattern. Once the RF electromagnetic field is known on one of the two planes, it can be propagated so that the intensity pattern in any plane can be determined. The lower two graphs show the two planes where the experimental data was obtained, and the heat maps therein show the beam profile as generated by the phase retrieval algorithm.

Figure 5:
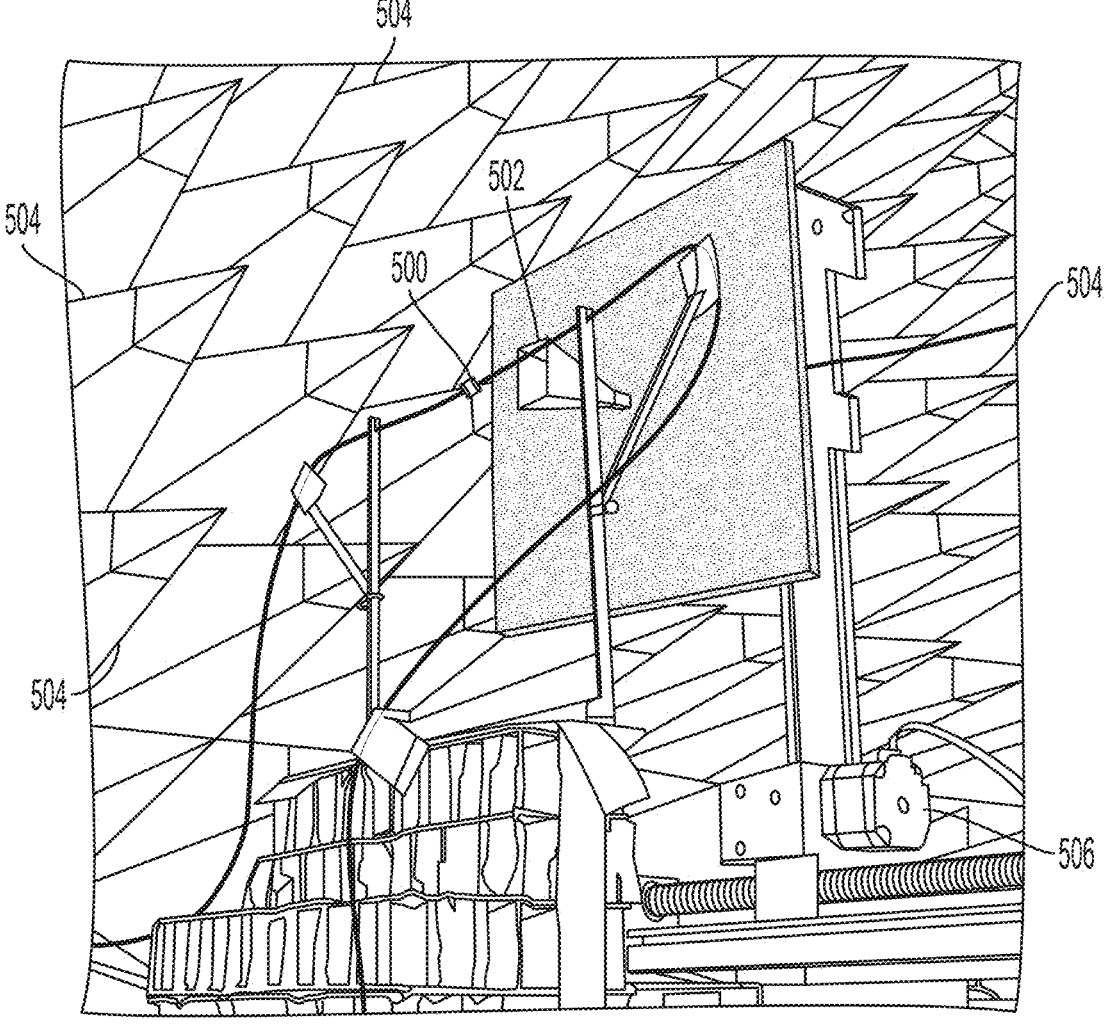
FIG. 5 is a picture of an example experimental setup for taking the measurements of FIG. 4.

FIG. 5 presents a picture of an example experimental setup for taking the measurements of FIG. 4. The example experimental setup includes a vapor cell 500 and an RF horn 502 that are disposed in an anechoic chamber. The anechoic chamber includes pyramidal protrusions 504 that are configured to dampen RF fields, and the vapor cell 500 is positioned in front of the RF horn 502. During operation, the RF horn 502 emits an RF electromagnetic field that is received by the vapor cell 500. An actuator system 504 moves the RF horn 502 relative to the vapor cell 500, which is stationary. The motion of the RF horn 502 allows the vapor cell 500 to traverse an array of locations on two planes that are in front of the RF horn 502. The motion of the RF horn 502 is such that the two planes reside in a radiating near-field region of the RF horn 502. The vapor cell 500 is thus able to measure an intensity of the RF electromagnetic field at each location of the array and in the radiating near-field region of the RF horn 502. Although FIG. 5 depicts the example experimental setup as having a single vapor cell, the vapor cell be replaced with multiple vapor cells (e.g., an array of vapor cells).

Figure 6A:
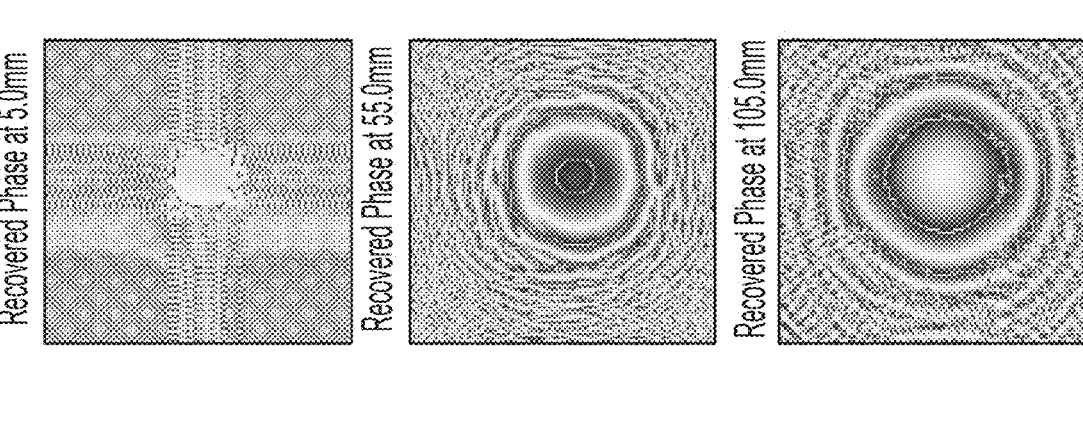
FIG. 6A is an array of contour graphs showing a first set of example measurements of an RF electromagnetic field from an RF antenna.
Figure 6A:
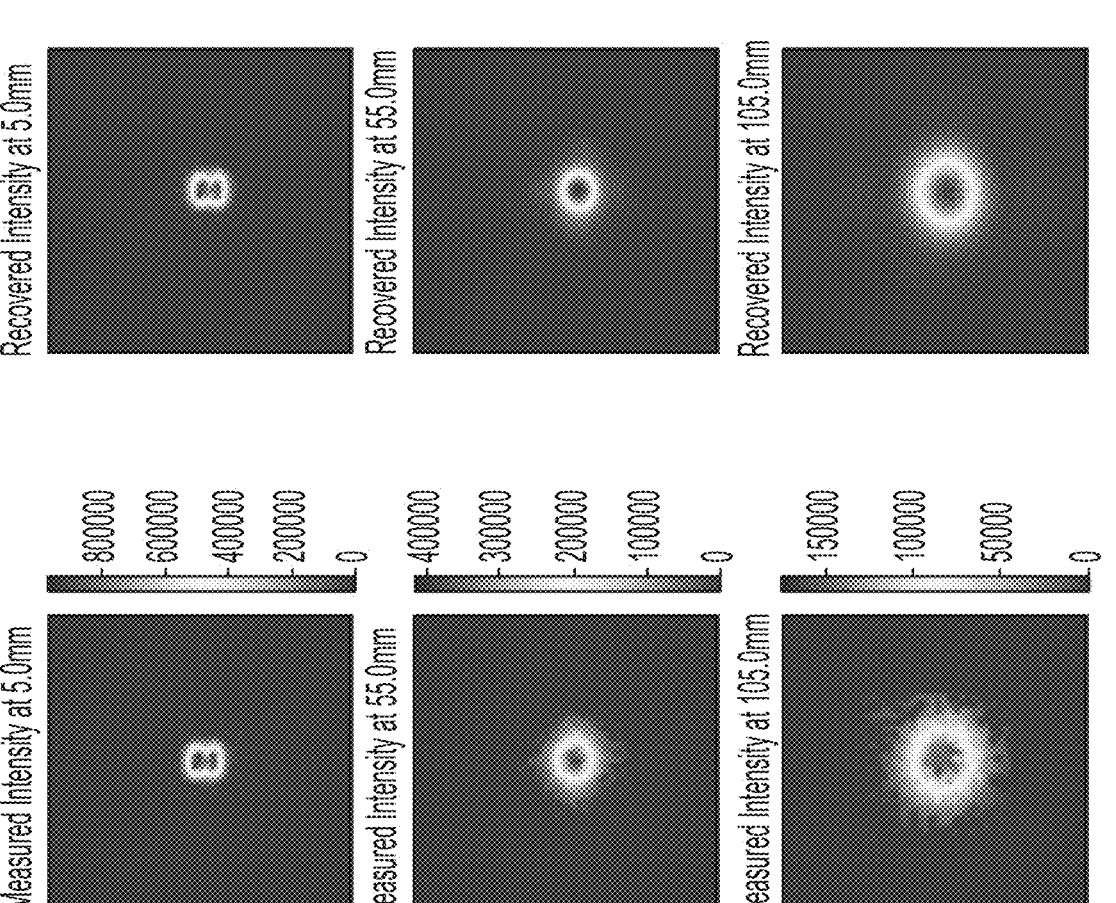
Figure 6B:
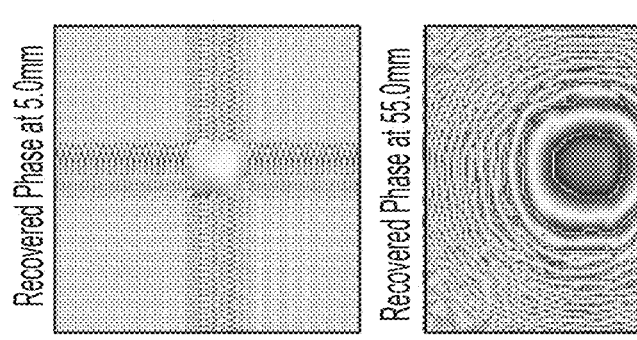
FIG. 6B is an array of contour graphs showing a second set of example measurements of the RF electromagnetic field from the RF antenna of FIG. 6A.
Figure 6B:
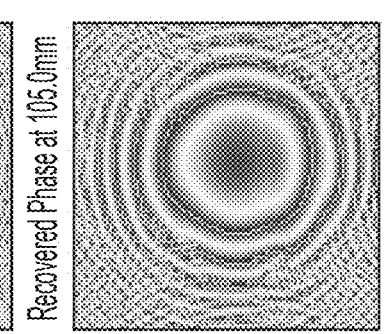
Figure 6B:
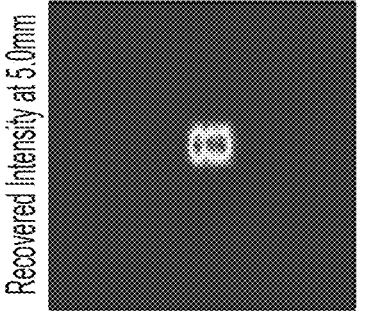
Figure 6B:
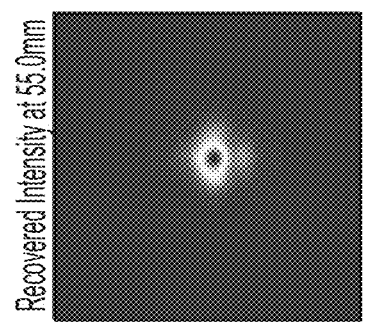
Figure 6B:
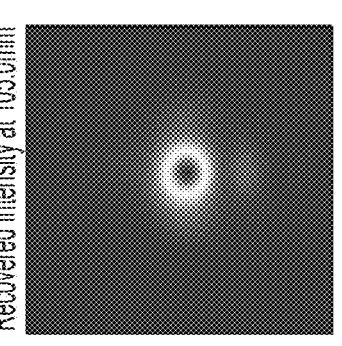
Figure 6B:
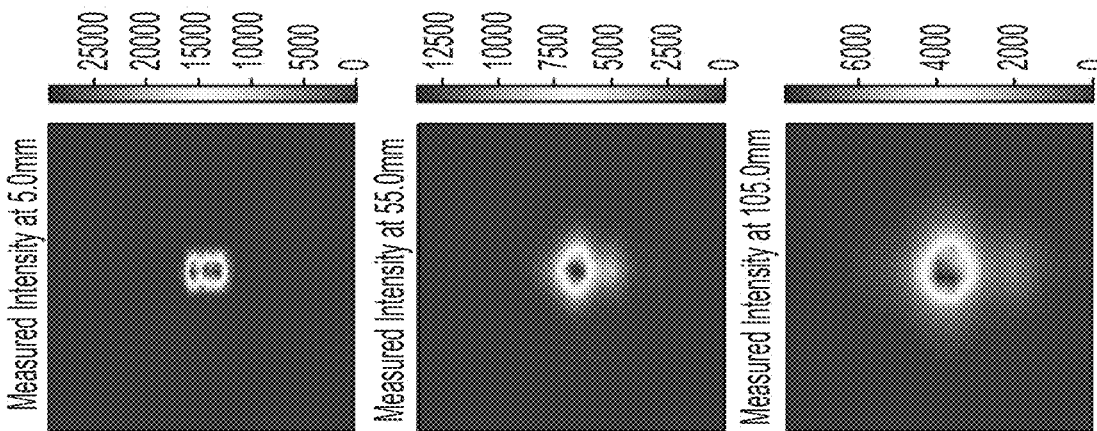

In order to characterize an RF electromagnetic field in the radiating near-field and far-field regions, preferably the Fresnel or Fraunhofer region, it may be necessary to determine the phase and amplitude of the electromagnetic field on at least one surface (e.g., a plane) across the extent of the aperture where it is nonzero. Once the RF electromagnetic field is known, it can be propagated using Maxwell's equations, or in the certain cases, using Fourier transforms using the Fresnel and Fraunhofer approximations. Amplitude and phase measurement on a subset of the RF electromagnetic field surface can also be important as signals can be encoded in the time-dependent phase and amplitude. As noted above, the amplitude of the RF electromagnetic field can be straightforward to measure with Rydberg vapor-based sensors. FIG. 6A shows an example of the measurement at 27.76 GHz, while FIG. 6B shows an example of the measurement at 26.21 GHz.

FIG. 6A presents an array of contour graphs showing a first set of example measurements of an RF electromagnetic field from an RF antenna. The first set of example measurements are conducted at 27.76 GHz. The leftmost column shows experimental data taken by scanning an RF horn antenna and measured with a Rydberg vapor-based sensor. The first two measurements are taken in the Fresnel region while the third measurement is in the far-field or Fraunhofer region. The two columns on the right are from the Fresnel region and show the recovered amplitude and phase using a Gerchberg-Saxton algorithm to recover the phase on each plane. The far-field pattern was generated by propagating the field and amplitude from the 5-mm image to the far-field. It can be compared to the measured far-field pattern in the left-most column. The data was taken at 27.76 GHz. FIG. 6B presents an array of contour graphs showing a second set of example measurements of the RF electromagnetic field from the RF antenna of FIG. 6A. The second set of example measurements are conducted at 26.21 GHz.

Figure 7:
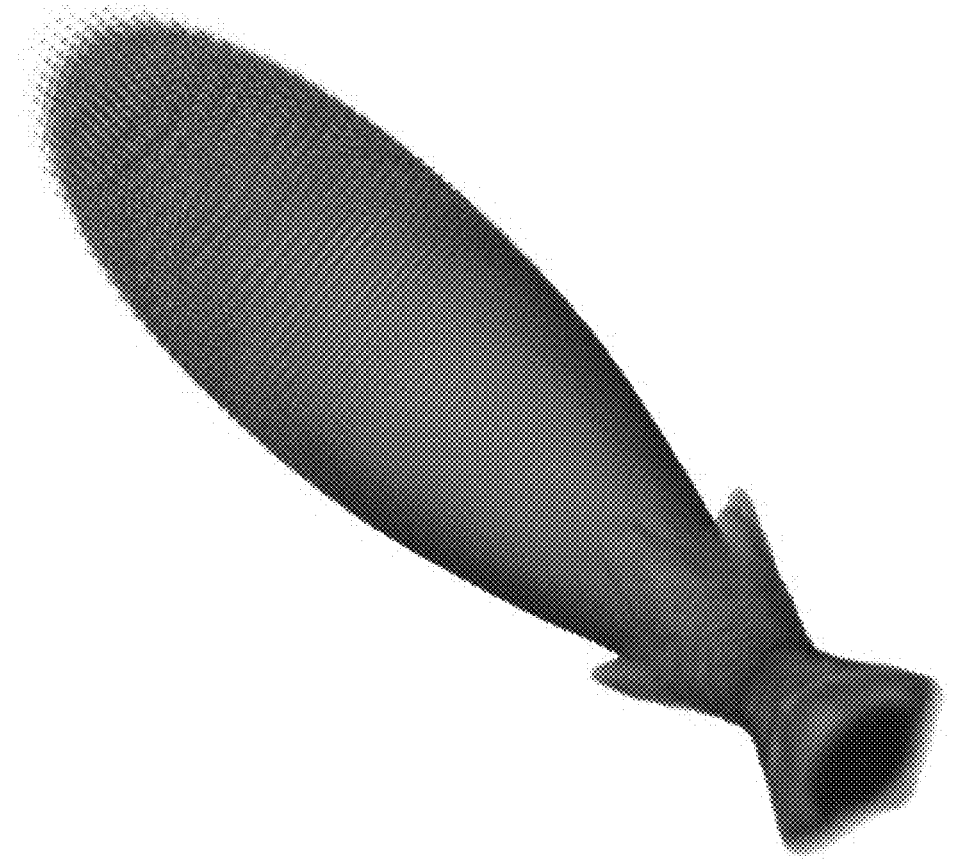
FIG. 7 is a contour graph showing an example of a recovered RF field intensity pattern that was determined from the data in the contour graphs of FIG. 6A.
Figure 8A:
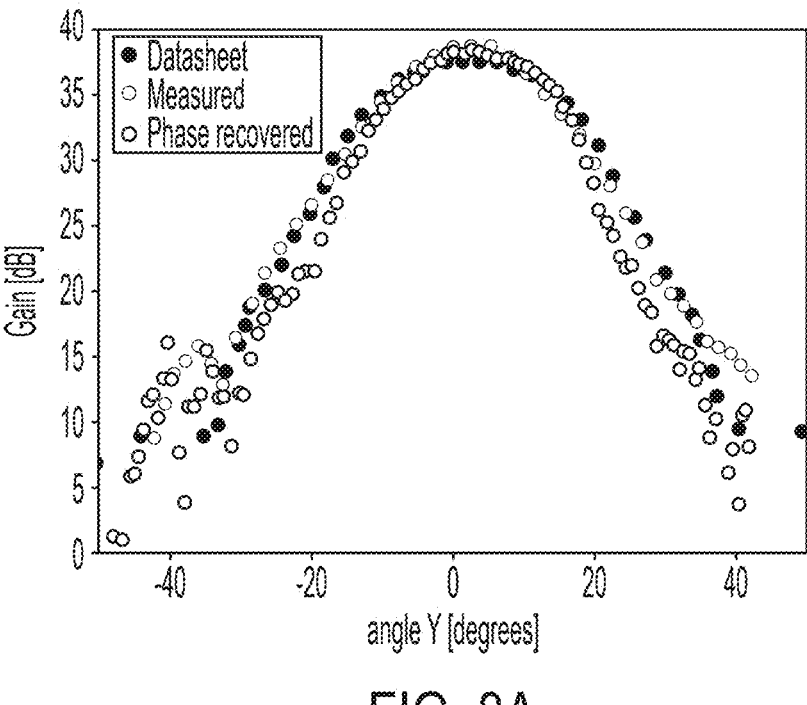
FIG. 8A is a graph showing, for an angle Y and the RF antenna of FIG. 6A, a comparison of a measured horn antenna gain pattern, a vendor data sheet gain pattern, and a gain pattern extracted from the Fresnel zone measurements.
Figure 8B:
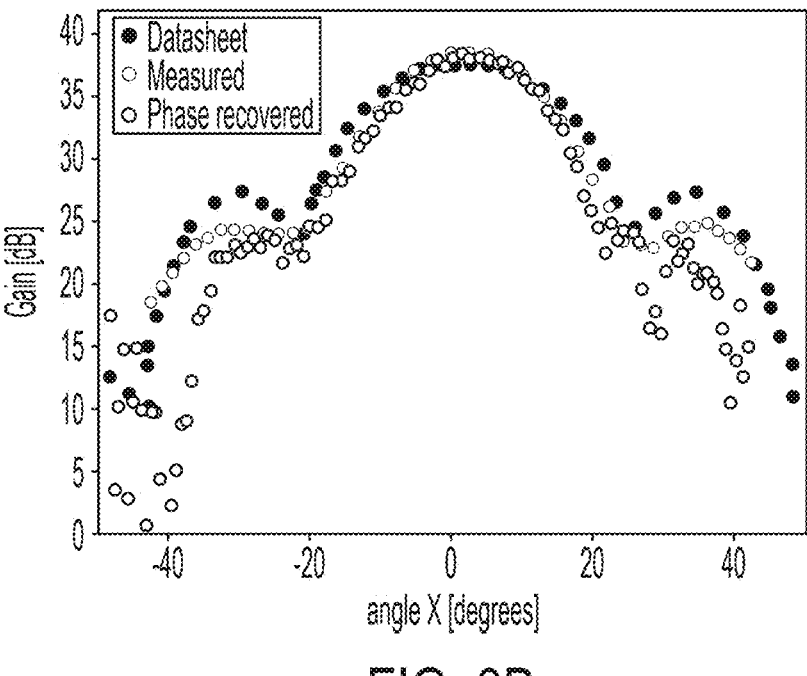
FIG. 8B is a graph showing, for an angle X and the RF antenna of FIG. 6A, a comparison of a measured horn antenna gain pattern, a vendor data sheet gain pattern, and a gain pattern extracted from the Fresnel zone measurements.

FIG. 7 presents a contour graph showing an example of a recovered RF field intensity pattern that was determined from the data in the contour graphs of FIG. 6A. In particular, FIG. 7 shows the beam shape that was extracted using a Gerchberg-Saxton algorithm to generate the phase and amplitude across a plane in the Fresnel region of the RF antenna. The RF field was propagated using standard diffraction theory to generate the RF field at enough planes to generate the three-dimensional image shown in FIG. 7. FIGS. 8A-8B show, for the RF antenna of FIG. 6A, a comparison of the measured RF horn antenna gain pattern, the vendor data sheet gain pattern, and the gain pattern extracted from the Fresnel region measurements. FIGS. 8A and 8B correspond to measurements at 27.76 GHz and at angles taken relative to the H and E planes labeled X and Y in the figure, respectively.

GPU testing of the HIO and GS algorithms was carried out to generate the contour graph of FIG. 7. A GTX-1650 GPU was able to run the GS algorithm on a 1024 element square array in 83 seconds. A GTX-970 performed the same calculation in 176 seconds. Both of these GPU cards are low end graphics cards. Large gain factors may be achieved by optimizing these algorithms for speed, thus doing a more efficient parallelization of the code and using a higher end graphics card. For example, the calculations may be sped up in a straightforward manner by a factor of over 100-fold.

In some implementations, a sensing system for sensing an RF field distribution of an RF emitting device includes a laser system, a signal processing system, a user interface, a mounting system for a vapor cell (or group thereof), and at least one vapor cell sensor. The at least one vapor cell sensor may be coupled via waveguide (e.g., fiber optic cable) to the laser control and signal processing systems. Additionally, the sensing system may include an actuator system (e.g., one or more remotely controlled translation stages) for positioning and orienting the at least one vapor cell sensor relative to the RF emitting device (e.g., a DUT). The actuator system may be useful if the at least one vapor cell sensor—whether as single sensor, a group or sensors, or an array or sensors—is not large enough to sample the RF electromagnetic field of the RF emitting device so that it can be reconstructed. The actuator system can be attached to the RF emitting device or the at least one vapor cell sensors. In some variations, the criterion for having enough vapor cell sensors may be dependent on the spatial structure of the RF electromagnetic field that needs to be reproduced, as determined by a Nyquist criterion. In some variations, a GPU card or FPGA processor can be included in the signal processing system in order to speed up the fast Fourier transforms (FFTs) that are necessary to carry out the phase retrieval algorithm.

In some implementations, the laser system includes at least two lasers that are configured for Rydberg vapor-based sensing, such as a probe laser and a coupling laser. The optical signal from the at least one vapor cell sensors can be generated using electromagnetically induced transparency (EIT) or electromagnetically induced absorption (EIA). A sub-Doppler method can be useful for higher spectral resolution in the Autler-Townes regime and higher sensitivity. One or more of the lasers may be locked to a stable, narrow bandwidth reference such as a frequency comb, an interferometer, or an atomic or molecular absorption line. To read out the optical signal, either laser can be scanned or the probe laser can be used to generate a frequency comb in an optical heterodyne setup. If a frequency comb is used, a real-time spectrum analyzer can be used to detect the signal. In the case of a frequency comb, it is not necessary to scan either of the lasers to read out the optical signal, although it is possible to obtain scanning and a frequency comb. Examples of frequency combs for Rydberg vapor-based sensing are described in U.S. Pat. No. 11,874,311 entitled "Detecting Radio Frequency Electromagnetic Radiation Using Vapor Cell Sensors and Comb Spectra".

In some implementations, the coupling laser of the EIT- or EIA-like vapor system can be tuned to different Rydberg electronic states to target different RF frequencies. Spectral signals within a bandwidth of about 250 MHz of the target frequency can be detected by analyzing the optical spectra, thereby allowing off-resonant signals to also be detected. The light in the control system, which may be necessary for monitoring the lasers and keeping them stable, can be routed via waveguide through all or part of the system. The light can be directed to the at least one vapor cell sensor in free-space or through an optical fiber. Feedback, to control the lasers, including feed forwards, can be realized using FPGAs, analog electronics, or another processor-based system that can be controlled through a user interface and through autonomous control layers operating in different types of processors.

In some implementations, the sensing system includes a photodetector to detect the probe laser signal. The photodetector senses changes in the transmission through the at least one vapor cell sensor due to the presence of RF electromagnetic fields. The optical signal from the at least one vapor cell sensor is converted to a digital signal that can be processed on a FPGA, GPU, or computer processor, or some combination thereof, including specialized hybrid processors. The sensing system is capable of storing the digital signal as a function of time and running it through multiple response templates. The response templates may assist in identifying the properties of the incoming, time dependent RF fields, in addition to the continuous wave signals that may be necessary for the phase retrieval process. The digital signals can be averaged together over time or acquired in real-time. Moreover, the digital signal train can be subjected to Fourier transform analysis in the FPGA, GPU, or another type of processing unit. The resulting data is used to measure RF field patterns from the RF emitting device (e.g., an AUT, am DUT, etc.). However, incoming signals that vary in time and space can be measured and used to calculate parameters such as peak power. The incoming signals can also be measured and used to decode transmission information as well as to calculate derivative information based on the measurements. The data is available in whole or in part to the user via the user interface. The digital signals can be stored in the sensing system for future evaluation in whole or in part, including the calculated data.

In some implementations, the user interface includes a computer readable code that can be run on a processor and changed by the user to control the laser system and signal processing system. The user interface may also be configured to run diagnostics to monitor the health of the system. The system, which in certain cases may be autonomous, interfaces with the user through the user interface, as does the signal processing system.

In some implementations, the at least one vapor cell sensor can be a metrology vapor cell, or cells, a conventional glass vapor cell, a conventional MEMs vapor cell, or another type of engineered vapor cell based on metamaterial or photonic crystal principles. The at least one vapor cell sensor can be encased in a thin electromagnetically transparent housing, such as one made from PLA plastic. Such an enclosure may be configured to accommodate a holder for the at least one vapor cell sensor and its waveguide (e.g., optical fiber). In implementations where the at least one vapor cell sensor is an array of vapor cells, the array of vapor cells can be mounted on a frame or net, e.g. a plastic frame. In implementations where the at least one vapor cell sensor is a group of vapor cells (e.g., an array), the group can include two or more vapor cells mounted in a plastic frame and separated by more than one wavelength of a target RF electromagnetic field. This type of setup can be scanned over the two planes simultaneously by measuring the field in both vapor cells. It is also possible to mount two arrays separated by more than a wavelength and measure two planes at one time. If there are a small number of vapor cell sensors in the two arrays, the arrays can be scanned together to measure the RF electromagnetic field in two planes simultaneously.

In some implementations, the sensing system can be battery powered, plugged into wall power, or both. Battery operation may be useful for remote field testing. However, some remote testing may allow for power supplied by a generator (e.g., a vehicle engine running an alternator to charge a battery and supply DC power).

In implementations where the sensing system is used for over-the-air testing in the field, the system may include a GPS receiver for positioning. However, in some implementations, the sensing system can be located in a laboratory or anechoic chamber. In general, the sensing system can function in a variety of environments, especially given that the RF measurements are made in the radiating near-field region of the RF emitting device.

Figure 9:
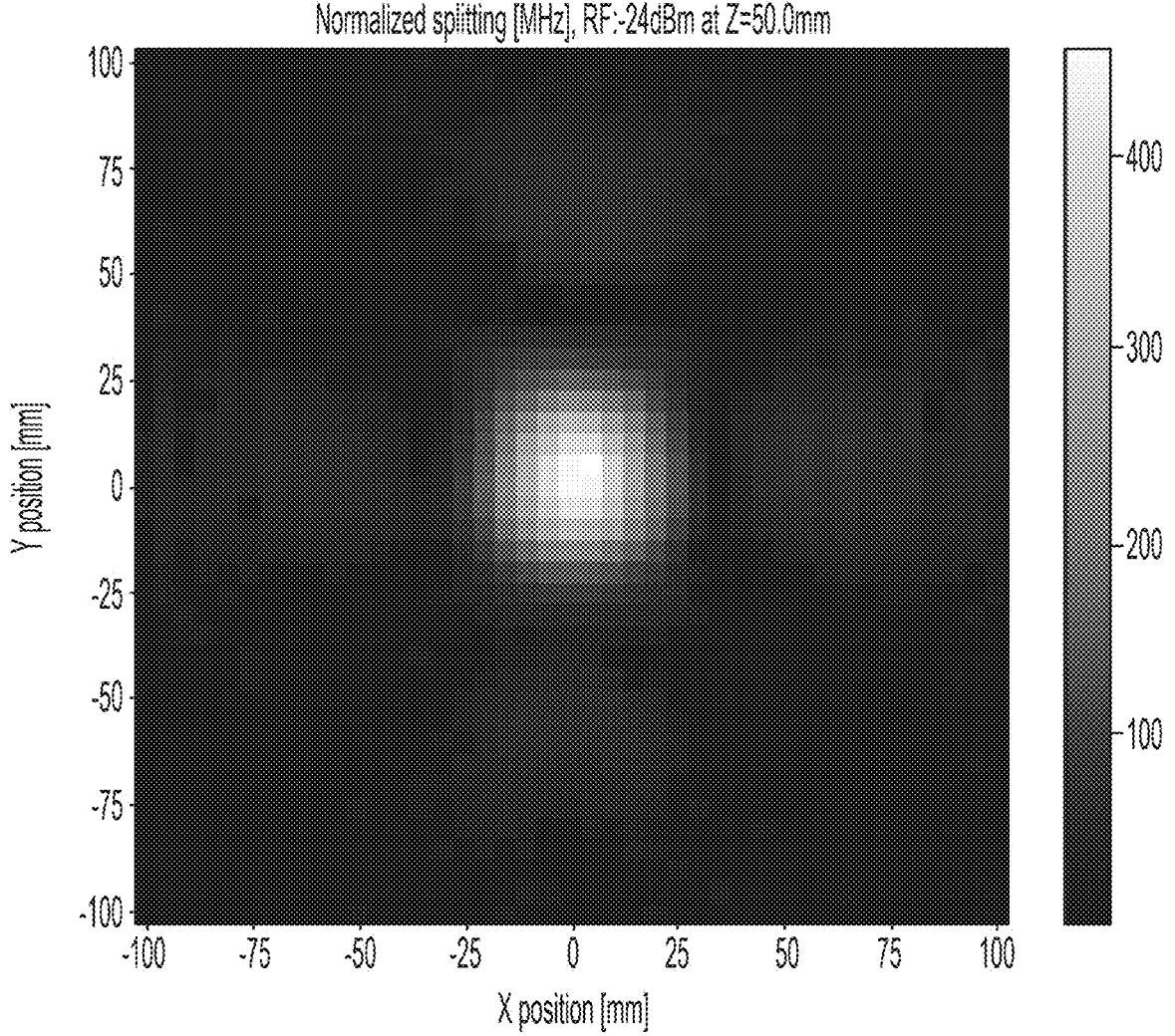
FIG. 9 is an example of an intensity image of a beam steered antenna at about 5 cm from the antenna surface.

FIG. 9 is an example of an intensity image of a beam steered antenna at about 5 cm from the antenna surface. The intensity image is taken with Rydberg vapor-based sensor of an electronically steered array at about 5 cm operating at 26.21 GHz.

In some aspects of what is described, a system may be described by the following examples. The system is configured to determine the properties of an RF field in regions of space, such as a radiating near-field region and a far-field region. The RF field may be produced by an RF source (e.g., an RF antenna or RF horn), and the properties of the RF field may include intensities and phases. In some implementations, the system is configured to determine an emission pattern of the RF source.

Example 1. A system comprising:
a vapor cell sensor system comprising one or more vapor cells that are configured to be positioned at an array of locations, the vapor cell sensor system configured to generate output signals based on operating the one or more vapor cells at the array of locations in a radiating near-field region of an RF field produced by an RF source; and
a signal processing system configured to perform operations that comprise:
generating, based on the output signals, measurement data representing measured intensities of the RF field in the radiating near-field region; and
generating, based on the measurement data, a model of the RF field produced by the RF source, the model comprising modeled intensities of the RF field in the radiating near-field region and a far-field region of the RF field.

Example 2. The system of example 1,
wherein the array of locations corresponds to first and second measurement domains in a Fresnel region of the RF field, the Fresnel region being part of the radiating near-field region; and
wherein the measurement data represent measured intensities of the RF field on the first and second measurement domains.

Example 3. The system of example 2,
wherein the first measurement domain corresponds to a first surface, and the second measurement domain corresponds to a second surface; and
wherein the first and second surfaces are separated by a distance greater than or equal to a wavelength of the RF field.

Example 4. The system of example 3, wherein the first and second surfaces are planar surfaces.

Example 5. The system of example 3, wherein the first and second surfaces are planar surfaces that are parallel to each other.

Example 6. The system of example 3 or any one of examples 4-5, wherein generating the model comprises projecting the measured intensities to a third surface in a Fraunhofer region of the RF field, the Fraunhofer region being part of the far-field region; and wherein the model comprises modeled intensities of the RF field at a plurality of locations on the third surface.

Example 7. The system of example 3 or any one of examples 4-6, wherein the model comprises modeled phases of the RF field on the first and second surfaces; and wherein generating the model comprises using a phase retrieval algorithm to generate the modeled phases based on the measurement data.

Example 8. The system of example 7, wherein generating the model comprises:

selecting boundary data comprising the measured intensities and the modeled phases of the RF field on at least one of the first and second surfaces; and using an RF diffraction model to generate the modeled intensities of the RF field in one or both of the radiating near-field region and the far-field region based on the boundary data.

Example 9. The system of example 1 or any one of examples 2-8, wherein the model comprises modeled intensities of the RF field at a plurality of points that represent an emission pattern of the RF source.

Example 10. The system of example 1 or any one of examples 2-9, wherein the one or more vapor cells is a first vapor cell, and the vapor cell sensor system comprises an actuator system that is configured to move the first vapor cell to each location in the array of locations.

Example 11. The system of example 1 or any one of examples 2-10, wherein the one or more vapor cells is a plurality of vapor cells, and the vapor cell sensor system comprises a mount that is configured to hold the plurality of vapor cells at respective locations of at least a portion of the array of locations.

Example 12. The system of example 1 or any one of examples 2-11, wherein the one or more vapor cells are each configured to generate optical signals in response to receiving laser signals from a laser system, the optical signals based on transmission of the laser signals through a vapor of the vapor cell, the vapor configured to alter a transmission of the laser signals in response to interacting with the RF field produced by the RF source.

Example 13. The system of example 12, wherein the vapor cell sensor system comprises an optical detector that is configured to generate the output signals in response to receiving the optical signals from the one or more vapor cells, the optical signals having respective intensities that are represented by the output signals; and wherein the signal processing system is configured to receive the output signals from the optical detector.

In some aspects of what is described, a signal processing system may be described by the following examples. The signal processing system is configured to determine the properties of an RF field in regions of space, such as a radiating near-field region and a far-field region. The RF field may be produced by an RF source (e.g., an RF antenna or RF horn), and the properties of the RF field may include intensities and phases. In some implementations, the signal processing system is configured to determine an emission pattern of the RF source.

Example 14. A signal processing system, comprising:
one or more processors; and memory storing instructions that, when executed by the one or more processors, cause the one or more processors to perform operations that comprise:

receiving output signals from a vapor cell sensor system that comprises one or more vapor cells, the output signals generated by operating the one or more vapor cells at an array of locations in a radiating near-field region of an RF field produced by an RF source;

generating, based on the output signals, measurement data representing measured intensities of the RF field in the near-field region; and generating, based on the measurement data, a model of the RF field produced by the RF source, the model comprising modeled intensities of the RF field in the radiating near-field region and a far-field region of the RF field.

Example 15. The signal processing system of example 14, wherein the array of locations corresponds to first and second measurement domains in a Fresnel region of the RF field, the Fresnel region being part of the radiating near-field region; and wherein the measurement data represent measured intensities of the RF field on the first and second measurement domains.

Example 16. The signal processing system of example 15, wherein the first measurement domain corresponds to a first surface, and the second measurement domain corresponds to a second surface; and wherein the first and second surfaces are separated by a distance greater than or equal to a wavelength of the RF field.

Example 17. The signal processing system of example 16, wherein the first and second surfaces are planar surfaces.

Example 18. The signal processing system of example 16, wherein the first and second surfaces are planar surfaces that are parallel to each other.

Example 19. The signal processing system of example 16 or any one of examples 17-18, wherein generating the model comprises projecting the measured intensities to a third surface in a Fraunhofer region of the RF field, the Fraunhofer region being part of the far-field region; and wherein the model comprises modeled intensities of the RF field at a plurality of locations on the third surface.

Example 20. The signal processing system of example 16 or any one of examples 17-19, wherein the model comprises modeled phases of the RF field on the first and second surfaces; and wherein generating the model comprises using a phase retrieval algorithm to generate the modeled phases based on the measurement data.

Example 21. The signal processing system of example 20, wherein generating the model comprises:

selecting boundary data comprising the measured intensities and the modeled phases of the RF field on at least one of the first and second surfaces; and using an RF diffraction model to generate the modeled intensities of the RF field in one or both of the radiating near-field region and the far-field region based on the boundary data.

Example 22. The signal processing system of example 14 or any one of examples 15-21, wherein the model comprises modeled intensities of the RF field at a plurality of points that represent an emission pattern of the RF source.

Example 23. The signal processing system of example 14 or any one of examples 15-22, wherein the one or more vapor cells is a first vapor cell;

wherein the vapor cell sensor system comprises an actuator system that is configured to move the first vapor cell; and wherein the operations comprise transmitting a control signal to the actuator system to move the first vapor cell to each location in the array of locations.

Example 24. The signal processing system of example 14 or any one of examples 15-23, wherein the one or more vapor cells is a plurality of vapor cells, and the vapor cell sensor system comprises a mount that is configured to hold the plurality of vapor cells at respective locations of at least a portion of the array of locations.

Example 25. The signal processing system of example 14 or any one of examples 15-24, wherein the one or more vapor cells are each configured to generate optical signals in response to receiving laser signals from a laser system, the optical signals based on transmission of the laser signals through a vapor of the vapor cell, the vapor configured to alter a transmission of the laser signals in response to interacting with the RF field produced by the RF source.

Example 26. The signal processing system of example 25, wherein the vapor cell sensor system comprises an optical detector that is configured to generate the output signals in response to receiving the optical signals from the one or more vapor cells, the optical signals having respective intensities that are represented by the output signals; and wherein receiving the output signals comprises receiving the output signals from the optical detector of the vapor cell sensor system.

In some aspects of what is described, a method may be described by the following examples. The method may be used to determine the properties of an RF field in regions of space, such as a radiating near-field region and a far-field region. The RF field may be produced by an RF source (e.g., an RF antenna or RF horn), and the properties of the RF field may include intensities and phases. In some instances, the method is used to determine an emission pattern of the RF source.

Example 27. A method comprising:

generating output signals from a vapor cell sensor system by operating one or more vapor cells of the vapor cell sensor system at an array of locations in a radiating near-field region of an RF field, the RF field produced by an RF source; and by operation of a signal processing system:

generating, based on the output signals, measurement data representing measured intensities of the RF field in the radiating near-field region, and generating, based on the measurement data, a model of the RF field produced by the RF source, the model comprising modeled intensities of the RF field in the radiating near-field region and a far-field region of the RF field.

Example 28. The method of example 27, wherein the array of locations corresponds to first and second measurement domains in a Fresnel region of the RF field, the Fresnel region being part of the radiating near-field region; and wherein the measurement data represent measured intensities of the RF field on the first and second measurement domains.

Example 29. The method of example 28, wherein the first measurement domain corresponds to a first surface, and the second measurement domain corresponds to a second surface; and wherein the first and second surfaces are separated by a distance greater than or equal to a wavelength of the RF field.

Example 30. The method of example 29, wherein the first and second surfaces are planar surfaces.

Example 31. The method of example 29, wherein the first and second surfaces are planar surfaces that are parallel to each other.

Example 32. The method of example 29 or any one of examples 30-31, wherein generating the model comprises projecting the measured intensities to a third surface in a Fraunhofer region of the RF field, the Fraunhofer region being part of the far-field region; and wherein the model comprises modeled intensities of the RF field at a plurality of locations on the third surface.

Example 33. The method of example 29 or any one of examples 30-32, wherein the model comprises modeled phases of the RF field on the first and second surfaces; and wherein generating the model comprises using a phase retrieval algorithm to generate the modeled phases based on the measurement data.

Example 34. The method of example 33, wherein generating the model comprises:

selecting boundary data comprising the measured intensities and the modeled phases of the RF field on at least one of the first and second surfaces; and using an RF diffraction model to generate the modeled intensities of the RF field in one or both of the radiating near-field region and the far-field region based on the boundary data.

Example 35. The method of example 27 or any one of examples 28-34, wherein the model comprises modeled intensities of the RF field at a plurality of points that represent an emission pattern of the RF source.

Example 36. The method of example 27 or any one of examples 28-35, wherein the one or more vapor cells is a first vapor cell;

wherein the vapor cell sensor system comprises an actuator system that is configured to move the first vapor cell; and wherein the method comprises moving, by operation of the actuator system, the first vapor cell to each location in the array of locations.

Example 37. The method of example 27 or any one of examples 28-36, wherein the one or more vapor cells is a plurality of vapor cells, and the vapor cell sensor system comprises a mount that is configured to hold the plurality of vapor cells at respective locations of at least a portion of the array of locations.

Example 38. The method of example 27 or any one of examples 28-37, wherein generating the output signals comprises:

generating, by operation of each vapor cell, respective optical signals in response to receiving laser signals at the vapor cell from a laser system, the respective optical signals based on transmission of the laser signals through a vapor of the vapor cell, the vapor configured to alter a transmission of the laser signals in response to interacting with the RF field produced by the RF source.

Example 39. The method of example 38, wherein the vapor cell sensor system comprises an optical detector;

wherein generating the output signals comprises generating, by operation of the optical detector, the output signals in response to receiving the optical signals at the optical detector from the one or more vapor cells, the optical signals having respective intensities that are represented by the output signals; and wherein the method comprises receiving the output signals at the signal processing system from the optical detector.

In some aspects of what is described, a signal processing method may be described by the following examples. The method may be used to determine the properties of an RF field in regions of space, such as a radiating near-field region and a far-field region. The RF field may be produced by an RF source (e.g., an RF antenna or RF horn), and the properties of the RF field may include intensities and phases. In some instances, the signal processing method is used to determine an emission pattern of the RF source.

Example 40. A signal processing method, comprising:

receiving output signals from a vapor cell sensor system that comprises one or more vapor cells, the output signals generated based on operating the one or more vapor cells at an array of locations in a radiating near-field region of an RF field produced by an RF source;

generating, based on the output signals, measurement data representing measured intensities of the RF field in the radiating near-field region; and generating, based on the measurement data, a model of the RF field produced by the RF source, the model comprising modeled intensities of the RF field in the radiating near-field region and a far-field region of the RF field.

Example 41. The signal processing method of example 40, wherein the array of locations corresponds to first and second measurement domains in a Fresnel region of the RF field, the Fresnel region being part of the radiating near-field region; and wherein the measurement data represent measured intensities of the RF field on the first and second measurement domains.

Example 42. The signal processing method of example 41, wherein the first measurement domain corresponds to a first surface, and the second measurement domain corresponds to a second surface; and wherein the first and second surfaces are separated by a distance greater than or equal to a wavelength of the RF field.

Example 43. The signal processing method of example 42, wherein the first and second surfaces are planar surfaces.

Example 44. The signal processing method of example 42, wherein the first and second surfaces are planar surfaces that are parallel to each other.

Example 45. The signal processing method of example 42 or any one of examples 43-44, wherein generating the model comprises projecting the measured intensities to a third surface in a Fraunhofer region of the RF field, the Fraunhofer region being part of the far-field region; and wherein the model comprises modeled intensities of the RF field at a plurality of locations on the third surface.

Example 46. The signal processing method of example 42 or any one of examples 43-45, wherein the model comprises modeled phases of the RF field on the first and second surfaces; and wherein generating the model comprises using a phase retrieval algorithm to generate the modeled phases based on the measurement data.

Example 47. The signal processing method of example 46, wherein generating the model comprises:

selecting boundary data comprising the measured intensities and the modeled phases of the RF field on at least one of the first and second surfaces; and using an RF diffraction model to generate the modeled intensities of the RF field in one or both of the radiating near-field region and the far-field region based on the boundary data.

Example 48. The signal processing method of example 40 or any one of examples 41-47, wherein the model comprises modeled intensities of the RF field at a plurality of points that represent an emission pattern of the RF source.

Example 49. The signal processing method of example 40 or any one of examples 41-48, wherein the one or more vapor cells is a first vapor cell;

wherein the vapor cell sensor system comprises an actuator system that is configured to move the first vapor cell; and wherein the signal processing method comprises transmitting a control signal to the actuator system to move the first vapor cell to each location in the array of locations.

Example 50. The signal processing method of example 40 or any one of examples 41-49, wherein the one or more vapor cells is a plurality of vapor cells, and the vapor cell sensor system comprises a mount that is configured to hold the plurality of vapor cells at respective locations of at least a portion of the array of locations.

Example 51. The signal processing method of example 40 or any one of examples 41-50, wherein the one or more vapor cells are each configured to generate optical signals in response to receiving laser signals from a laser system, the optical signals based on transmission of the laser signals through a vapor of the vapor cell, the vapor configured to alter a transmission of the laser signals in response to interacting with the RF field produced by the RF source.

Example 52. The signal processing method of example 51, wherein the vapor cell sensor system comprises an optical detector that is configured to generate the output signals in response to receiving the optical signals from the one or more vapor cells, the optical signals having respective intensities that are represented by the output signals; and wherein receiving the output signals comprises receiving the output signals from the optical detector of the vapor cell sensor system.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A signal processing system, comprising:
one or more processors; and
memory storing instructions that, when executed by the one or more processors, cause the one or more processors to perform operations that comprise:
receiving output signals from a vapor cell sensor system that comprises one or more vapor cells, the output signals generated by operating the one or more vapor cells at an array of locations in a radiating near-field region of an RF field produced by an RF source;
generating, based on the output signals, measurement data representing measured intensities of the RF field in the near-field region; and
generating, based on the measurement data, a model of the RF field produced by the RF source, the model comprising modeled intensities of the RF field in the radiating near-field region and a far-field region of the RF field.

2. The signal processing system of claim 1,
wherein the array of locations corresponds to first and second measurement domains in a Fresnel region of the RF field, the Fresnel region being part of the radiating near-field region; and
wherein the measurement data represent measured intensities of the RF field on the first and second measurement domains.

3. The signal processing system of claim 2,
wherein the first measurement domain corresponds to a first surface, and the second measurement domain corresponds to a second surface; and
wherein the first and second surfaces are separated by a distance greater than or equal to a wavelength of the RF field.

4. The signal processing system of claim 3, wherein the first and second surfaces are planar surfaces.

5. The signal processing system of claim 3, wherein the first and second surfaces are planar surfaces that are parallel to each other.

6. The signal processing system of claim 3,
wherein generating the model comprises projecting the measured intensities to a third surface in a Fraunhofer region of the RF field, the Fraunhofer region being part of the far-field region; and
wherein the model comprises modeled intensities of the RF field at a plurality of locations on the third surface.

7. The signal processing system of claim 3,
wherein the model comprises modeled phases of the RF field on the first and second surfaces; and
wherein generating the model comprises using a phase retrieval algorithm to generate the modeled phases based on the measurement data.

8. The signal processing system of claim 7, wherein generating the model comprises:
selecting boundary data comprising the measured intensities and the modeled phases of the RF field on at least one of the first and second surfaces; and
using an RF diffraction model to generate the modeled intensities of the RF field in one or both of the radiating near-field region and the far-field region based on the boundary data.

9. The signal processing system of claim 1, wherein the model comprises modeled intensities of the RF field at a plurality of points that represent an emission pattern of the RF source.

10. The signal processing system of claim 1,
wherein the one or more vapor cells is a first vapor cell;
wherein the vapor cell sensor system comprises an actuator system that is configured to move the first vapor cell; and
wherein the operations comprise transmitting a control signal to the actuator system to move the first vapor cell to each location in the array of locations.

11. The signal processing system of claim 1, wherein the one or more vapor cells is a plurality of vapor cells, and the vapor cell sensor system comprises a mount that is configured to hold the plurality of vapor cells at respective locations of at least a portion of the array of locations.

12. The signal processing system of claim 1, wherein the output signals are received from an optical detector of the vapor cell sensor system.

13. The signal processing system of claim 1, comprising one or more field programmable gate array (FPGAs), one or more graphics processing units (GPUs), or a combination of one or more FPGAs and GPUs.

14. A signal processing method, comprising:
receiving output signals from a vapor cell sensor system that comprises one or more vapor cells, the output signals generated based on operating the one or more vapor cells at an array of locations in a radiating near-field region of an RF field produced by an RF source;
generating, based on the output signals, measurement data representing measured intensities of the RF field in the radiating near-field region; and
generating, based on the measurement data, a model of the RF field produced by the RF source, the model comprising modeled intensities of the RF field in the radiating near-field region and a far-field region of the RF field.

15. The signal processing method of claim 14,
wherein the array of locations corresponds to first and second measurement domains in a Fresnel region of the RF field, the Fresnel region being part of the radiating near-field region; and
wherein the measurement data represent measured intensities of the RF field on the first and second measurement domains.

16. The signal processing method of claim 15,
wherein the first measurement domain corresponds to a first surface, and the second measurement domain corresponds to a second surface; and
wherein the first and second surfaces are separated by a distance greater than or equal to a wavelength of the RF field.

17. The signal processing method of claim 16, wherein the first and second surfaces are planar surfaces.

18. The signal processing method of claim 16, wherein the first and second surfaces are planar surfaces that are parallel to each other.

19. The signal processing method of claim 16, wherein generating the model comprises projecting the measured intensities to a third surface in a Fraunhofer region of the RF field, the Fraunhofer region being part of the far-field region; and wherein the model comprises modeled intensities of the RF field at a plurality of locations on the third surface.

20. The signal processing method of claim 16, wherein the model comprises modeled phases of the RF field on the first and second surfaces; and wherein generating the model comprises using a phase retrieval algorithm to generate the modeled phases based on the measurement data.

21. The signal processing method of claim 20, wherein generating the model comprises:

selecting boundary data comprising the measured intensities and the modeled phases of the RF field on at least one of the first and second surfaces; and using an RF diffraction model to generate the modeled intensities of the RF field in one or both of the radiating near-field region and the far-field region based on the boundary data.

22. The signal processing method of claim 14, wherein the model comprises modeled intensities of the RF field at a plurality of points that represent an emission pattern of the RF source.

23. The signal processing method of claim 14, wherein the one or more vapor cells is a first vapor cell;

wherein the vapor cell sensor system comprises an actuator system that is configured to move the first vapor cell; and wherein the signal processing method comprises transmitting a control signal to the actuator system to move the first vapor cell to each location in the array of locations.

24. The signal processing method of claim 14, wherein the one or more vapor cells is a plurality of vapor cells, and the vapor cell sensor system comprises a mount that is configured to hold the plurality of vapor cells at respective locations of at least a portion of the array of locations.

25. The signal processing method of claim 14, wherein receiving the output signals comprises receiving the output signals from an optical detector of the vapor cell sensor system.

* * * * *